(12) United States Patent
Yu et al.

(10) Patent No.: US 9,337,874 B1
(45) Date of Patent: May 10, 2016

(54) HIGH-SPEED DIGITAL SIGNAL PROCESSING SYSTEMS

(71) Applicant: Intel IP Corporation, Santa Clara, CA (US)

(72) Inventors: Chuanzhao Yu, Phoenix, AZ (US); Mark Kirschenmann, Chandler, AZ (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/575,939

(22) Filed: Dec. 18, 2014

(51) Int. Cl.
*H03C 1/00* (2006.01)
*H04B 1/04* (2006.01)
*H04L 27/20* (2006.01)
*H03M 7/16* (2006.01)
*H03M 1/66* (2006.01)

(52) U.S. Cl.
CPC . *H04B 1/04* (2013.01); *H03M 1/66* (2013.01); *H03M 7/165* (2013.01); *H04L 27/20* (2013.01)

(58) Field of Classification Search
CPC ....... H04L 12/2898; H04L 5/00; H04L 17/00; H04L 27/20; H04B 1/00; H04B 3/00; H04B 7/00; H04B 10/00; H04B 13/00; H04B 14/006; H03C 1/00; H03D 3/00
USPC .......................... 375/222, 302, 295–297, 320
See application file for complete search history.

(56) References Cited

U.S. PATENT DOCUMENTS

| | | | | |
|---|---|---|---|---|
| 5,221,926 A * | 6/1993 | Jackson | ............... | H03M 1/0665 341/118 |
| 5,406,283 A * | 4/1995 | Leung | .................. | H03M 1/0665 341/143 |
| 5,808,573 A * | 9/1998 | Shih | .................. | G11B 20/10055 341/110 |
| 5,977,899 A * | 11/1999 | Adams | .................... | H03M 3/50 341/143 |
| 6,154,162 A * | 11/2000 | Watson | ............... | H03M 1/0673 341/144 |
| 6,246,352 B1 * | 6/2001 | Fattaruso | .............. | H03M 1/145 341/154 |
| 6,271,781 B1 * | 8/2001 | Pellon | .................... | H03M 3/388 341/143 |
| 6,348,884 B1 * | 2/2002 | Steensgaard-Madsen | ............... | H03M 1/0665 341/118 |
| 6,518,899 B2 * | 2/2003 | Yu | ...................... | H03M 1/0668 341/118 |
| 6,614,377 B1 * | 9/2003 | Adams | ................ | H03M 1/0665 341/144 |
| 6,624,774 B2 * | 9/2003 | Takeda | .................. | H03M 3/346 341/143 |
| 6,674,380 B1 * | 1/2004 | Essenwanger | ........ | G06F 1/0328 341/110 |
| 6,683,928 B2 * | 1/2004 | Bhullar | ................. | H03L 7/0814 327/156 |
| 6,816,103 B2 * | 11/2004 | Jonsson | ................ | H03M 1/066 341/144 |
| 7,081,844 B1 * | 7/2006 | Huang | ................. | H03K 17/162 341/135 |
| 7,193,548 B2 * | 3/2007 | Kaplan | ............... | H03M 1/0665 341/118 |
| 7,199,740 B1 * | 4/2007 | Ferguson, Jr. | ......... | H03M 1/806 341/144 |
| 7,239,116 B2 * | 7/2007 | Tang | ..................... | H02M 3/157 323/266 |
| 7,474,243 B1 * | 1/2009 | Kuttner | ............... | H03M 1/0863 341/136 |
| 7,701,286 B2 * | 4/2010 | Gupta | .................. | H03F 3/2178 330/127 |
| 7,773,968 B2 * | 8/2010 | Maxim | .................. | H04B 1/001 341/126 |
| 7,839,319 B2 * | 11/2010 | Nittala | .................. | H03M 1/462 341/160 |
| 7,893,856 B2 * | 2/2011 | Ek | ....................... | H03M 1/0678 341/144 |

(Continued)

*Primary Examiner* — Emmanuel Bayard
(74) *Attorney, Agent, or Firm* — Schwegman Lundberg & Woessner, P.A.

(57) ABSTRACT

Apparatus and method to provide a high speed digital signal processor may implemented in a substantially all digital transmitter designs. In an embodiment, input binary bits are divided into two sets of bits, where one set is provided to a binary to thermometer coder to generate an output mixed with a clock signal to operatively provide a reverse order inverted bit pattern. The other set of binary bits is subject to exclusive-or processing such that processing of the two sets operatively provides a mixed hybrid code to be fed from high speed digital signal processor. Additional apparatus, systems, and methods are disclosed.

26 Claims, 23 Drawing Sheets

(56) References Cited

U.S. PATENT DOCUMENTS

| | | | |
|---|---|---|---|
| 7,969,340 B2 * | 6/2011 | Lou | H03M 7/3033 341/143 |
| 7,990,294 B2 * | 8/2011 | Doi | H03M 9/00 341/100 |
| 7,999,718 B2 * | 8/2011 | Shin | H03M 1/141 327/57 |
| 8,085,178 B2 * | 12/2011 | Turner | H03M 1/08 341/144 |
| 8,115,519 B2 * | 2/2012 | Turner | G06F 1/0335 327/105 |
| 8,471,743 B2 * | 6/2013 | Huang | H03M 1/502 341/143 |
| 8,542,773 B2 * | 9/2013 | Yu | H03M 1/68 341/143 |
| 8,552,783 B2 * | 10/2013 | Rylov | H03H 11/265 327/276 |
| 8,593,318 B2 * | 11/2013 | Kaald | H03M 3/37 341/143 |
| 8,611,163 B2 * | 12/2013 | Romanovskyy | G11C 7/222 365/194 |
| 8,736,476 B2 * | 5/2014 | Gong | H03M 1/0673 341/144 |
| 8,781,026 B2 * | 7/2014 | Muhammad | H03C 1/00 332/103 |
| 8,837,656 B2 * | 9/2014 | Stojanovic | H03L 7/091 375/355 |
| 8,896,476 B2 * | 11/2014 | Harpe | H03M 1/02 341/118 |
| 8,903,092 B2 * | 12/2014 | Ostrem | 341/110 |
| 8,907,708 B2 * | 12/2014 | van Engelen | H03L 7/099 327/149 |
| 8,928,384 B2 * | 1/2015 | Rylov | H03H 11/265 327/276 |
| 8,953,950 B2 * | 2/2015 | Nazarathy | H03M 1/145 398/188 |
| 8,994,467 B2 * | 3/2015 | Lee | H03L 7/095 331/117 FE |
| 2006/0215709 A1 * | 9/2006 | Kuwata | H03M 5/06 370/535 |
| 2006/0255997 A1 * | 11/2006 | Li | H03F 1/26 341/156 |
| 2008/0079619 A1 * | 4/2008 | Sakurai | H03M 1/0665 341/144 |
| 2008/0180579 A1 * | 7/2008 | Maxim | H04B 1/0003 348/735 |
| 2008/0181340 A1 * | 7/2008 | Maxim | H03D 7/1441 375/346 |
| 2011/0043258 A1 * | 2/2011 | Baek | G06F 1/022 327/106 |
| 2011/0084812 A1 * | 4/2011 | Shimura | G06K 7/0008 340/10.3 |
| 2012/0286891 A1 * | 11/2012 | Schimper | H04L 27/34 332/105 |
| 2013/0194051 A1 * | 8/2013 | Zimlich | H03K 7/08 332/109 |
| 2013/0251068 A1 * | 9/2013 | Boos | H04L 27/00 375/302 |
| 2014/0328429 A1 * | 11/2014 | Kuttner | H03M 1/66 375/295 |
| 2015/0326229 A1 * | 11/2015 | Boecker | H03L 7/0814 327/158 |

* cited by examiner

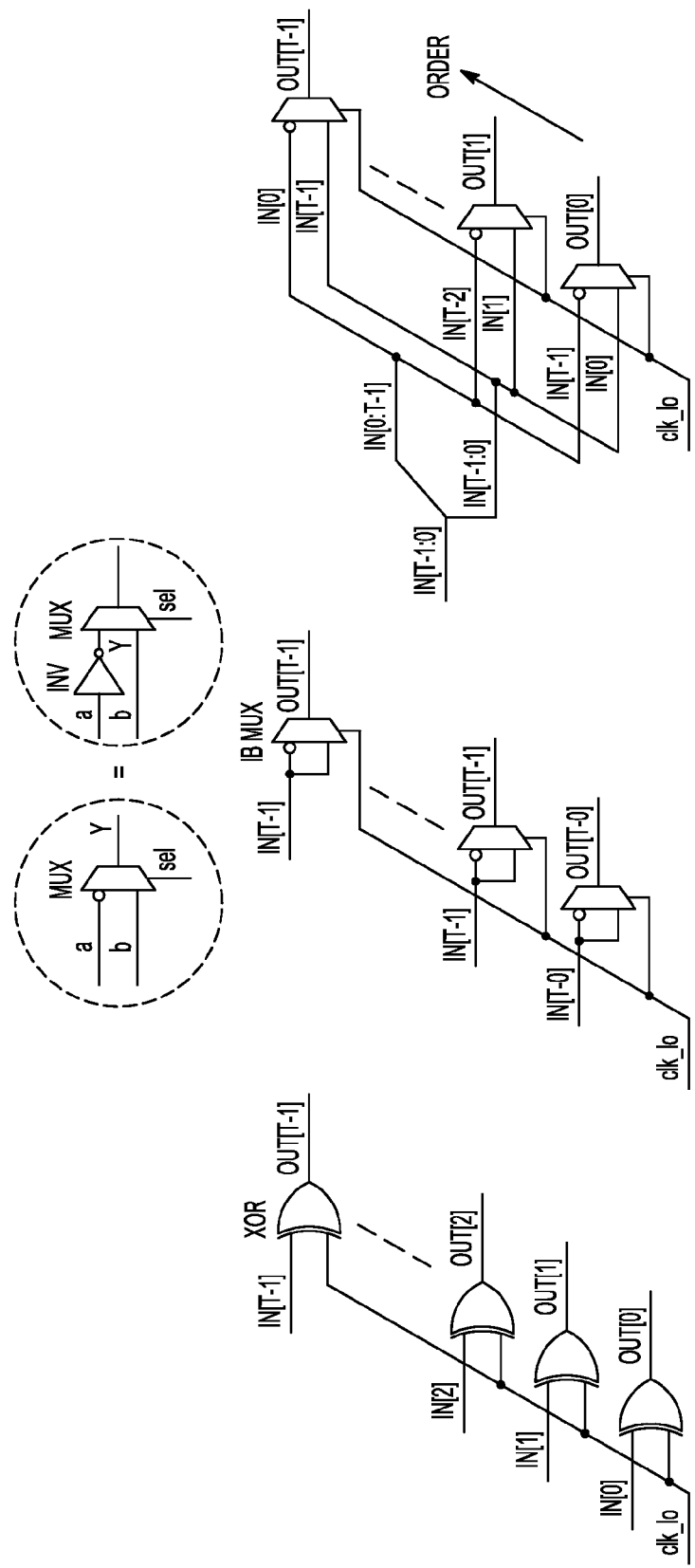

FIG. 4A ns in accordance with some embodiments.
HIGH-SPEED DIGITAL SIGNAL PROCESSING SYSTEMS

TECHNICAL FIELD

Examples relate generally to digital systems. Some examples relate to digital transmitters including transmitters referred to as all digital transmitters. Some examples relate to digital transmitters suitable for cellular communications including communications in accordance with one of the mobile communication standards, such as 3GPP LTE standards. Some examples relate to digital transmitters suitable for Wi-Fi and WLAN communications.

BACKGROUND

Radio frequency digital to analog converters (RF DACs), digital power amplifier (DPAs), and digital drive amplifiers (DDAs) become more and more attractive for a wireless transceiver design with advance CMOS technology, because of the scalability with the device size shrinking, the easy design for the band width controls, smaller layout area to reduce the die cost, and numerous digital advantages. The so-called all digital transmitter uses a digital block to drive the RF DAC, DPA, or DDA. The digital block, which can be realized as a high-speed digital signal processor (HS DSP), may implement signal up-conversion and data coding. Enhanced designs for HS DSPs are highly desired.

BRIEF DESCRIPTION OF THE DRAWINGS

Embodiments are illustrated by way of example and not limitation in the figures of the accompanying drawings in which:

FIGS. 3A-3C illustrate examples of digital mixing in accordance with some embodiments in accordance with some embodiments.

FIGS. 4A-4C show examples of digital mixer output data patterns with different mixing methods in accordance with some embodiments.

DETAILED DESCRIPTION

The following detailed description refers to the accompanying drawings that show, by way of illustration, details and embodiments in which embodiments may be practiced. These embodiments are described in sufficient detail to enable those skilled in the art to practice them. Other embodiments may be utilized and structural, logical, and electrical changes may be made without departing from the inventive subject matter. The various embodiments disclosed herein are not necessarily mutually exclusive, as some embodiments can be combined with one or more other embodiments to form new embodiments. The following detailed description is, therefore, not to be taken in a limiting sense.

In an example digital system having a HS DSP to drive a RF DAC, DPA, or the DDA, the signal up-conversion of the HS DSP may be configured to mix input digital baseband signals with input local oscillator (LO) clocks and to provide a data format for transferring signals including a structure to generate a thermometer code for the RF DAC, DPA, or the DDA, which can reduce the glitch energy introduced by the binary code. Because the up-converted data may be re-timed at the output of the HS DSP by a D flip-flop (DFF) block to align the data bits, the output data rate is at least double that of the mixing clock. For example, the LO clock may be about 2.69 GHz for LTE high band operation, where the highest operational clock for the HS DSP is double of the mixing clock frequency. It is at about 5.38 GHz. With such high frequency clock for the HS DSP, the design and implementation may present a big challenge.

Figure 1A:
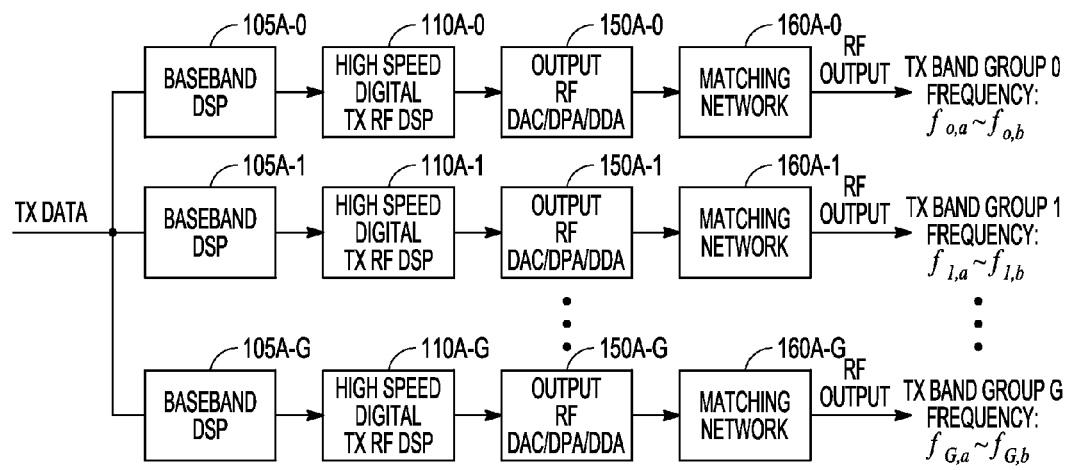
FIGS. 1A-1C show block diagrams of examples of structures for all-digital transmitters in accordance with some embodiments.
Figure 1B:
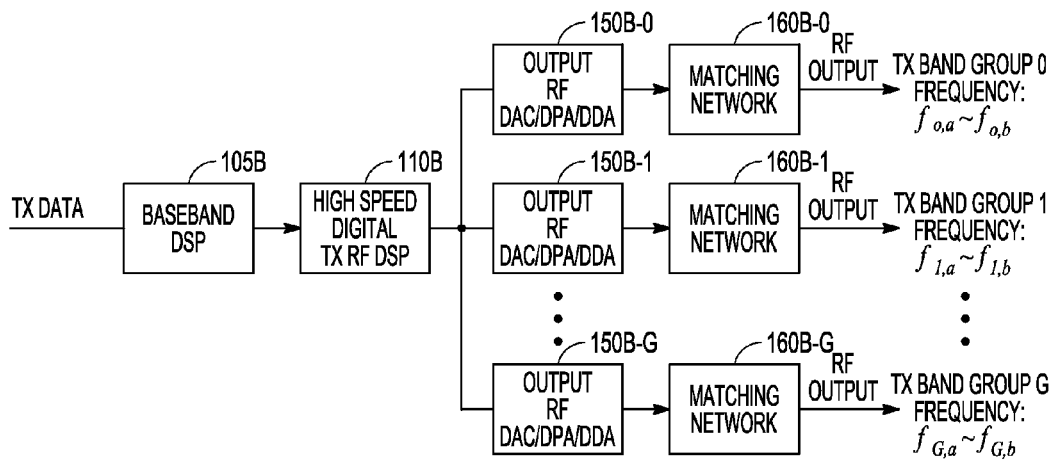
Figure 1C:
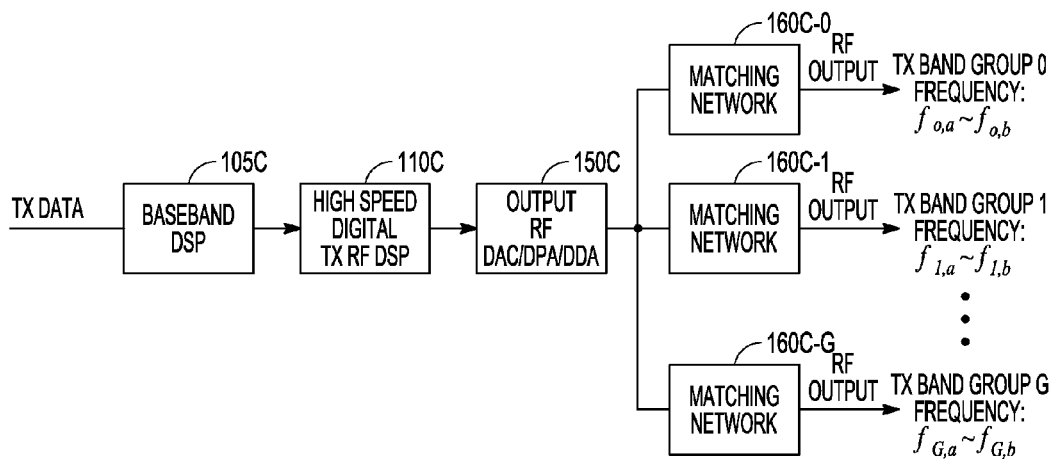

FIGS. 1A-1C show block diagrams of examples of structures for all-digital transmitters. FIG. 1A shows a complete segmented transmission (TX) path for each of a number of TX band groups: Group 0, Group 1 . . . Group G in frequency ranges $f_{0,a} \sim f_{0,b}$, $f_{1,a} \sim f_{1,b}$ . . . $f_{G,a} \sim f_{G,b}$, respectively. Data for transmission is input to baseband DSPs 105A-0, 105A-1 . . . 105A-G. Each of baseband DSPs 105A-0, 105A-1 . . . 105A-G provides data to a corresponding HS DSP 110A-0, 110A-1 . . . 110A-G that drives corresponding output RFD AC/DPA/DDA 150A-0, 150A-1 . . . 150A-G. Each of HS DSP 110A-0, 110A-1 . . . 110A-G can be structured as taught herein. Output from each output RFD AC/DPA/DDA 150A-

0, 150A-1 . . . 150A-G can be input to a corresponding matching network 160A-0, 160A-1 . . . 160A-G, each of which provide an RF output.

FIG. 1B shows a baseband DSP and a HS DSP as a front end (FE) common to each segmented transmission path of a number of TX band groups: Group 0, Group 1 . . . Group G in frequency ranges $f_{0,a}$~$f_{0,b}$, $f_{1,a}$~$f_{0,b}$, . . . $f_{G,a}$~$f_{G,b}$, respectively. Data for transmission is input to baseband DSP 105B that provides data to a HS DSP 110B that drives each output RFD AC/DPA/DDA 150B-0, 150B-1 . . . 150B-G. HS DSP 110B can be structured as taught herein. Output from each output RFD AC/DPA/DDA 150B-0, 150B-1 . . . 150B-G can be input to a corresponding matching network 160B-0, 160B-1 . . . 160B-G, each of which provide an RF output.

FIG. 1C shows a baseband DSP, a HS DSP, and an output device as a FE common to each transmission path through a matching network of a number of TX band groups: Group 0, Group 1 . . . Group G in frequency ranges $f_{0,a}$~$f_{0,b}$, $f_{1,a}$~$f_{0,b}$, . . . $f_{G,a}$~$f_{G,b}$, respectively, where the output device may be one or more of a DAC, a DPA, or a DDA. Data for transmission is input to baseband DSP 105C that provides data to a HS DSP 110C that drives output RFD AC/DPA/DDA 150C. HS DSP 110C can be structured as taught herein. Output from output RFD AC/DPA/DDA 150C can be input to each of matching network 160C-0, 160C-1 . . . 160C-G, each of which provides an RF output.

To satisfy multiple band requirements for a multiple mode multiple band (MMMB) transmitter, the TX path can be grouped as segmented band groups. Each band group covers one frequency range, which may be optimized to an output matching network (including the capacitor tuner, baluns, and the matching networks) for the covered frequency range. To reduce the connection parasitic between the blocks, one can separate the baseband DSP and the HS DSP FE for each of band groups 0, 1, . . . G, as shown in FIG. 1A. With the HS DSP and the output device operated in higher frequency clock, compared to the baseband DSP, one can only separate the HS DSP and the output device and share the baseband DSP, as shown in FIG. 1B. By doing this, one can save on layout area and save on current consumption. To further reduce the layout area and current consumption, one can share the same baseband DSP, the same HS DSP, and the same output device, as shown in FIG. 1C. Any example of a HS DSP taught herein may be used in all there three structures for substantially all digital transmitter designs.

To reduce glitch energy, a thermometer code is used for the RF DAC/DPA/DDA. However, the thermometer coded bit width will be much larger than that of the binary code of the same value. For example, a 15 bit binary data in thermometer code format has a bit width of $2^{15}-1=32727$. To operate such huge number of bits in the high frequency digital circuit is typically not possible. The current consumption is also not allowable. To have reasonable bit width data and smaller glitch energy simultaneously, a hybrid thermometer/binary code can be used for the HS DSP output data. The input binary code, for example from a baseband DSP, can be split into two parts—an upper set and a lower set. The upper set of bits (USB or MSB) can be converted to the thermometer code by the coder and the lower set bits (LSB) can be kept as a binary code. The thermometer code and the binary code can be mixed with a LO signal by different methods. For the thermometer code, a reverse order inverted bit (ROIB) method can be used. A reverse order inverted bit method inverts each bit and reverses the order of the bits. Reverse order inverted bit (ROIB) can also be referred to as reverse order reversed bit (ROIB or RORB). For the binary code, an XOR mixing method can be used.

Consider ROIB mixing for the thermometer code. For an N bit input, the binary to thermometer coder/converter (B/T coder) has $T=2^N-1$ effective bits. For example, for a 4 bit input B/T coder, the output thermometer code (T-code) has 15 bits. To finish a digital up-conversion mixing operation in thermometer format, the T-bit output unary code value can be kept if the local oscillator clock (clk_lo)=1b'0, where 1b'0 is a single binary bit at state 0, and all the T bits can be inverted if clk_lo=1'b1, where 1b'1 is a single binary bit at state 1.

Figures 2A, 2B, 2C:
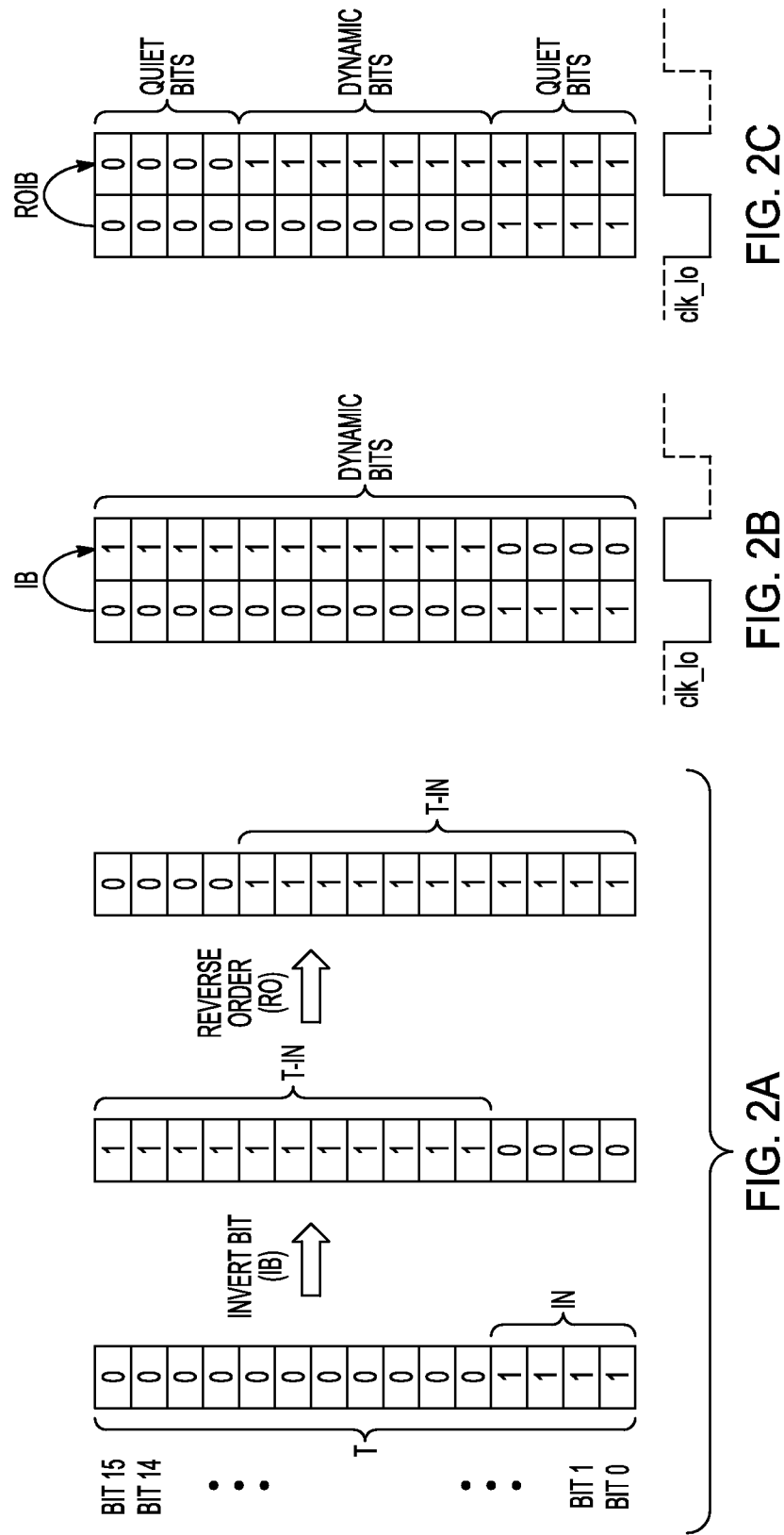
FIGS. 2A-2C illustrate examples of digital up-conversion mixing for a thermometer code in accordance with some embodiments.

FIG. 2A shows a demonstration of a T-code inverted bit and reverse order mixing. In this figure, the example T-code has a value for the T-code of 4 (IN=4). The lower 4 bits of the T-code are logic 1 and the upper 11 bits are logic 0. To finish the digital mixing for the T-code, in half of the LO period (clk_lo=1b'0), the value of the output of the mixer is 4, and in another half of the LO period (clk_lo=1'b1), the value of the output of the mixer is T−4=11. The mixing operation can be implemented by 2-input XOR gates for each bit of the T-code: one of the XOR input is connected to the individual bit of the T-code and the other input of the XOR gate connected to the clk_lo signal, as shown in FIG. 3A, which is an example of XOR mixing. FIG. 3B shows an example of inverted bit mixing using multiplexers (MUXs) and inverters. FIG. 3B may be considered to be an alternative way to implement the operation of FIG. 3A, by reversing each of the bits and switching between the original bit and the inverted bits by a two-input MUX with the clk_lo signal as selection input. FIG. 2B shows results of the reverse bit (RB) mixing, as referred to as invert bit (IB) mixing, relative to clk_lo, and FIG. 2C shows results of reverse order reverse bit (ROIB) mixing relative to clk_lo.

The mixing methods shown in FIGS. 3A and 3B generate the same output data pattern, as shown in FIG. 2B. Each bit of the output data from the digital mixer was toggled between logic 0 and logic 1. In other words, each of the bits of the digital mixer output is active, which causes high current consumptions, especially for the RF DAC, which has high-current drivers for each of the active bits. A bit is active if it toggles with each half cycle of an associated clock. To optimize the current consumptions and reduce the noise, an alternative way for the IB (inverted bit) mixing is to reverse the order (RO) of all the reversed bits in second half of the clk_lo (clk_lo=1'b1) as shown in FIG. 3C, which shows reverse order inverted bit mixing. The T code can be an order set of bit location from bit location[0] to bit location [T−1]. Input to each of the MUXs of FIG. 3C can include two bits. The two bits for each MUX can be selected from the order of bit locations of the thermometer code such that bit locations of the two bits are equally spaced apart from opposite ends of the order, where one of the two bits can be inverted.

The ROIB mixing can be seen as an improved mixing operation based on the IB mixing. However, the data pattern is different. As shown in FIG. 2C, the ROIB mixing has 8 bits unchanged bits during the mixing (upper 4 bits and lower 4 bits), although the value is the same as the IB mixing for each half period of the clk_lo clock. Unchanged bits that do not toggle between logic 1 and logic 0 over the time are called quiet bits. Quiet bits typically only cost small current and do not contribute noise to the output. By neglecting the leakage current, the 8 quiet bits will not draw the current in this period because there is no bit transition inside this period of the LO clock.

Figure 4A:
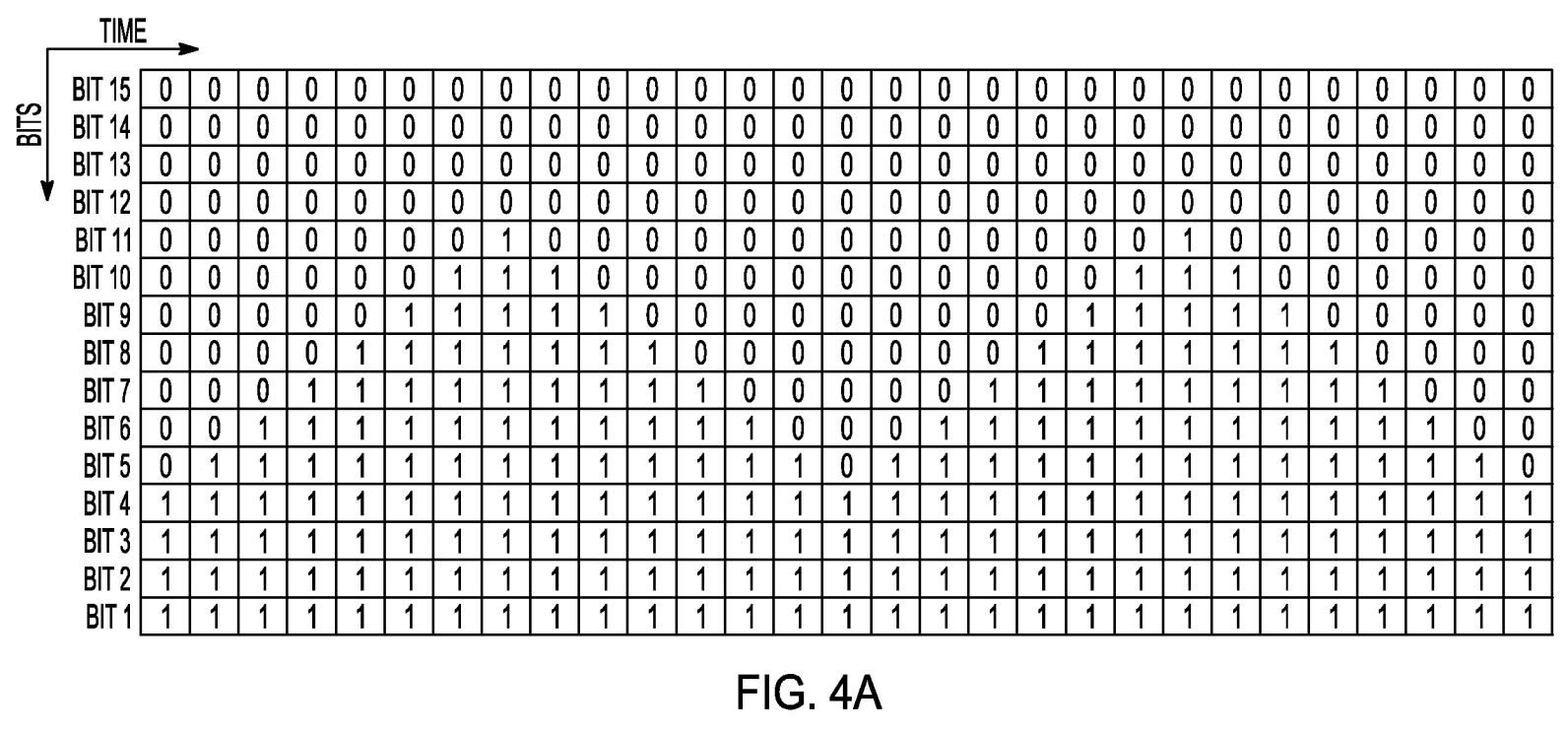
Figure 4B:
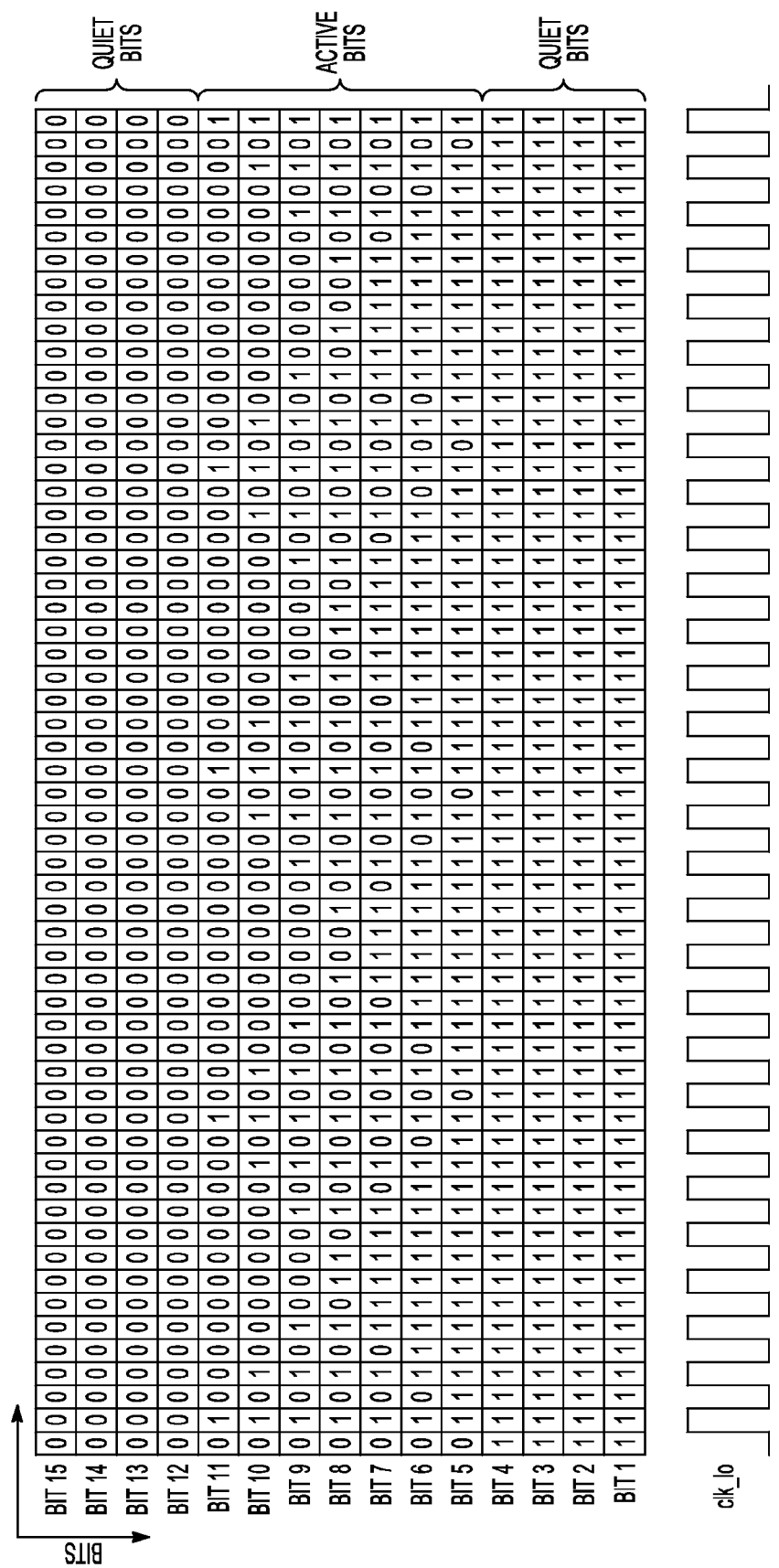
Figure 4C:
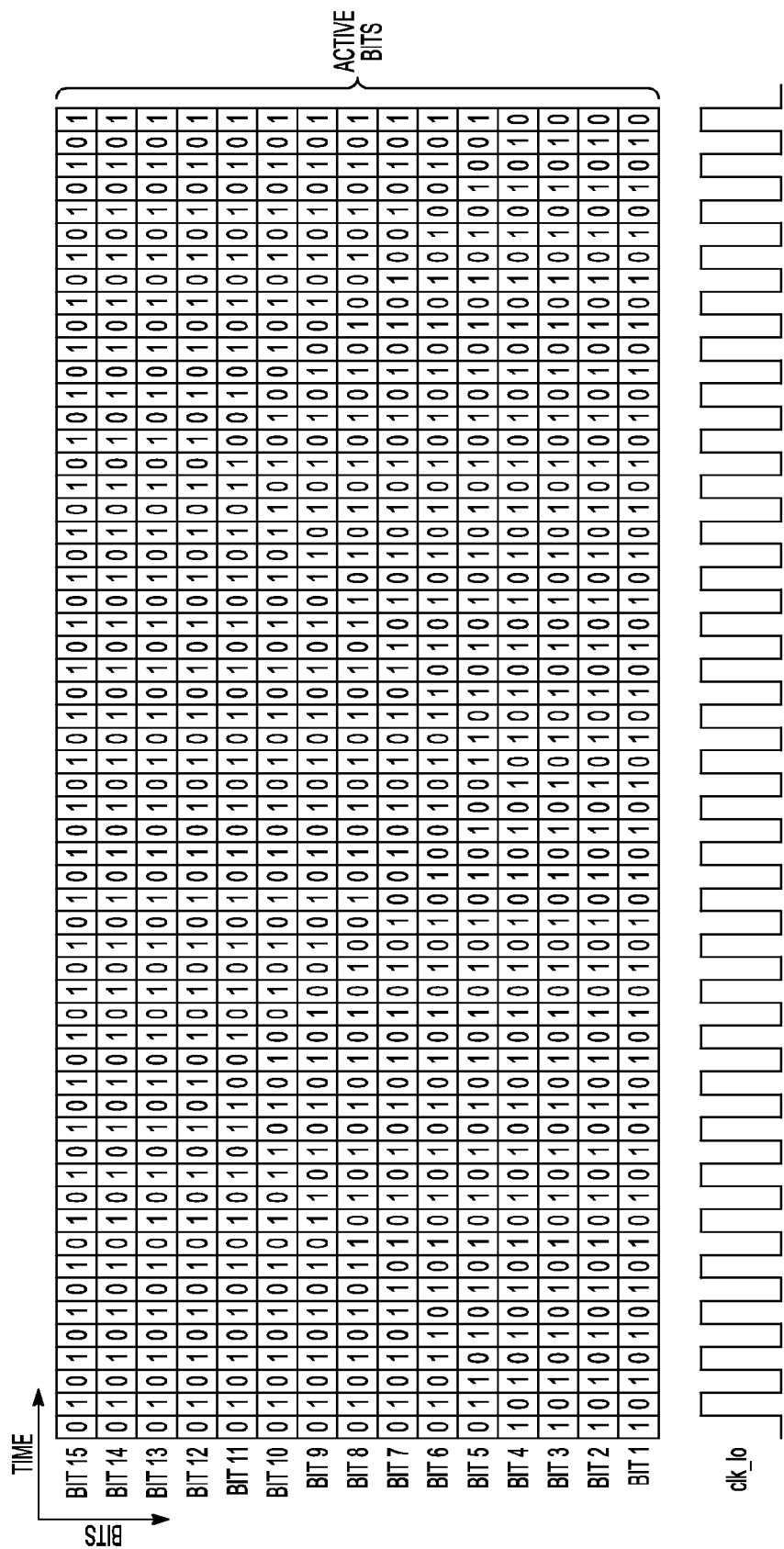

FIGS. 4A-4C show examples of digital mixer output data patterns with different mixing methods. FIG. 4A shows input baseband digital data, which, in this example, is a triangle waveform with 15-bit T-code inputs (BIT1 to BIT15). The vertical direction is the data bits from BIT1 to BIT15 and the horizontal direction is the time slots. The data rate is half of the clk_lo frequency. FIG. 4B shows the digital mixer output data pattern with the IB mixing. The clk_lo waveform is given at the bottom below the representation of the bit pattern. In each first half of the clk_lo period (=1'b0), the output of the mixer has the same value as the baseband input. In each second half of the clk_lo period (=1'b1), each bit of the output of the mixer is the inverted value of the input bit (BIT[X]=!BIT[X], X=1, 2, ... 15, where !BIT[X] has a value that is inverted or toggled from the value of X). From the data pattern of FIG. 4B, one can see that all the bits are in active mode.

FIG. 4C shows the digital mixer output for the ROIB mixing. In each first half of the clk_lo period (=1'b0), each bit of the output has the same value as the corresponding input baseband bit. In the second half of the clk_lo period (=1'b1), the bit is the inverted value of the reversed order bit (BIT[X]=!BIT[T−X], where in the example of FIGS. 4A-C, T=15, X=1, 2, 3, ..., 15). For the ROIB output data, there are 8 bits that never got toggled (BIT1, BIT2, BIT3, BIT4 and BIT12, BIT13, BIT14, BIT15). These bits are called quiet bits (QBs). The QBs do not draw current for the power supply if the leakage current can be neglected. The number of the QBs depends on the amplitude of the input baseband data: the smaller the baseband input signal, the more the QB bits. A consideration on the input data can include the average of the input data being located at the T/2.

Consider XOR mixing for the binary code in 2's complementary format. If the mixer input baseband data is in a binary code, it is not possible to have a ROIB mixing, because of the different bit weight for each bit, where reversing the bit order will result in a different value. However, the XOR and IB mixing are still valid for the binary code. The XOR mixing and the IB mixing result totally in the same output. To save current, the XOR mixing can be selected for the binary code mixing, because implementing gate logic is simpler than implementing an IB mux.

Figure 5A:
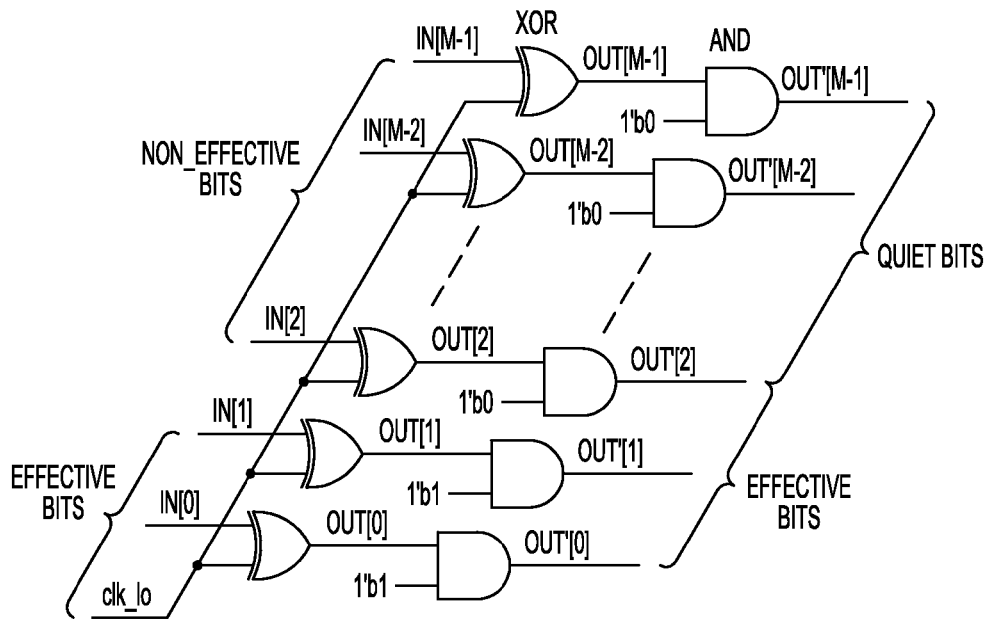
FIGS. 5A-5C show examples of exclusive-or mixing and bit quieting in accordance with some embodiments.

For the XOR mixing of binary code, the RF DAC/DPA/DDA can finish the digital signal combination operation for the HS DSP output code as:

$$RF_{out} = \sum_{k=0}^{M-1} 2^k \cdot OUT[k]$$

where the OUT[k] is the k-th bit of the XOR mixer output in either value 1 (for logic 1) or value 0 (for logic 0). The term k is an integer from 0 to M−1, where M is the bit width for the XOR mixer input. For the XOR mixing, as mentioned in the example above, every bit of the output may be toggled in any period of the LO clock period. It is not necessary for the base-band signal with small value in binary code. To avoid the unnecessary toggle of the non-effective bits, one can quiet the bit after the XOR mixing with an AND gate as shown in FIG. 5A, which shows XOR mixing with quiet control. Non-effective bits are quiet bits. To quiet a bit is to de-activate the bit such that the bit becomes a quiet bit.

Figure 5B:
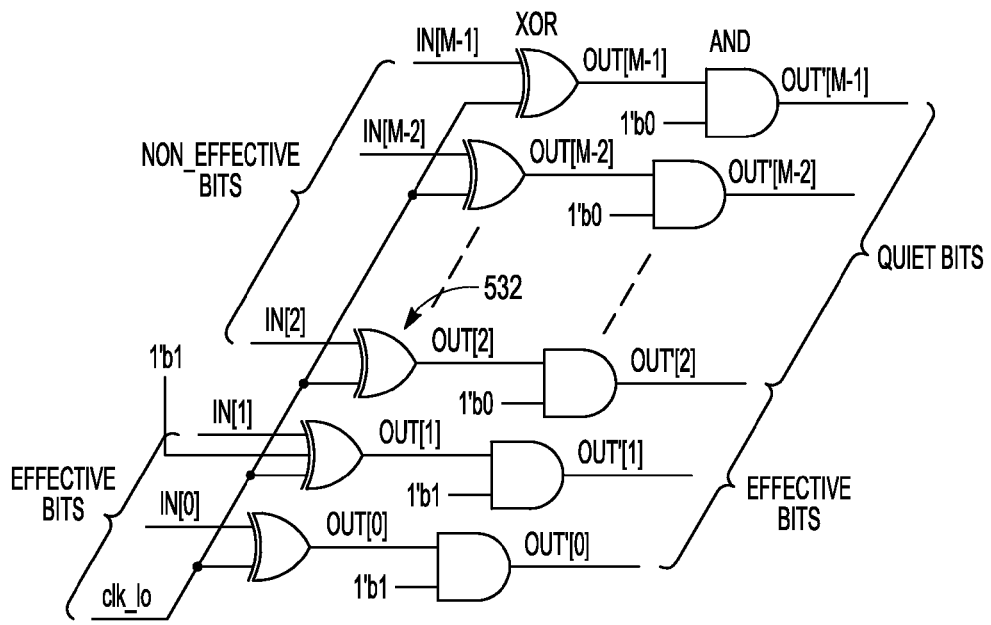

In FIG. 5A, the non-effective bits are all AND with logic 0, and the effective bits are AND with logic 1 to have a symmetric logic as the non-effective bits. Usually, an RF DAC/DPA/DDA requires the unsigned binary input, rather than the 2's compliment code, which is usually used by the TX baseband. To satisfy this requirement, the highest bit of the effective bit can be reversed to transfer the 2's complement to unsigned binary with the width effective bit. FIG. 5B shows XOR mixing with quiet control and data format conversion. A 3-input XOR 532, instead of 2-input XOR may be used for the highest effective bits of the XOR mixer, as shown in FIG. 5B, to reverse that bit and XOR mix that bit at the same time. The extra input for the 3-input XOR can be connected to logic 1.

Figure 5C:
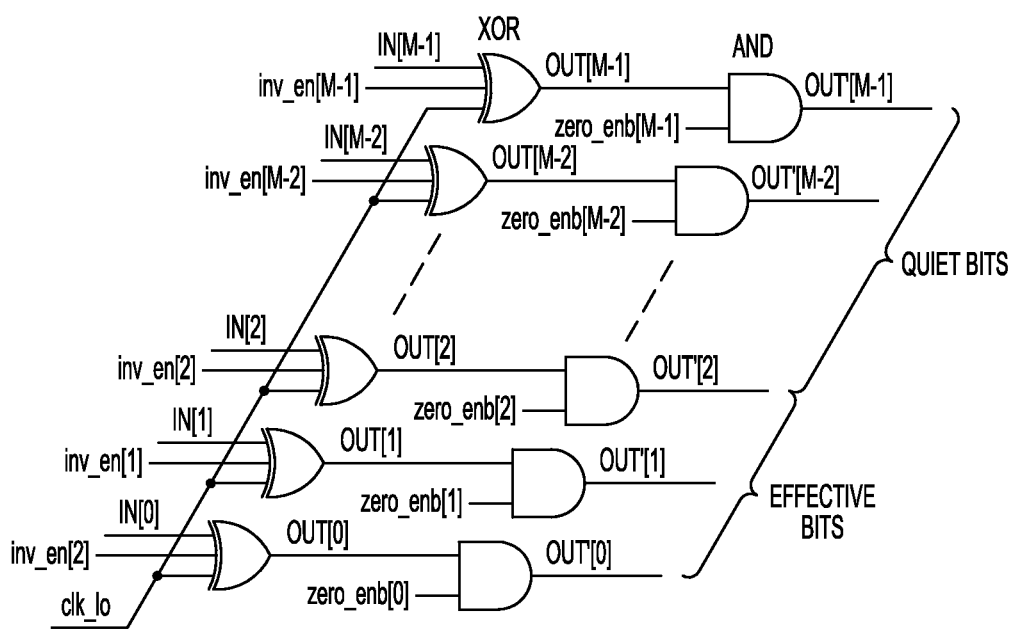

FIG. 5C shows XOR mixing with quiet control and data format conversion. All the XOR gates are 3-input XOR gates that include a control such as an invert enable signal (inv_en[X]) relative to a particular bit X, where, in FIG. 5C, X ranges from 0 to M−1. Ground may also be used as a control for 3-input XOR that provides an extra bit as shown in FIG. 5C. A control such as a zero enable signal (zero_enb[X]) relative to a particular bit X can be AND with a corresponding output OUT[X] of the XOR gates. The set of AND gates provide a set of quiet bits and a set of effective bits, where the effective bits may include an extra bit.

The principle and the details for quiet operation may be considered with respect to level shifting to quiet the unnecessary bits. In operation, the peak value of the input baseband data may vary from one mode to another. Even in the same mode, the different digital gain settings may result in different peak values of the input baseband data. It may be full scale or smaller gain from the full scale to save current (reduce current consumption). Therefore, the effective bit number could be different from mode to mode or from setting to setting. For the RF DACs, the RF gain control range may be limited. Most of the power out (Pout) range can be achieved using a digital attenuator (cutting back gain) before the RF DAC. At very high attenuations (60-80 dB), the desired signal has a small value.

However, the MSBs of the data out of the HS DSP with IB mixing still toggle due to the behaviors of IB digital mixing. The toggled MSBs have higher combination weight in the RF DAC and the glitch energy can introduce undesired noise. The signal-to-noise ratio (SNR) of the output RF signal may be worse. Simulations showed that at 80 dB digital attenuation, carrier leakage and error vector magnitude (EVM) performance are poor because the toggled MSB introduced transition noise. To have better noise performances for these lower output power applications, an adjustable quiet control may be implemented for the IB mixing method to save current and improve the spectrum purity. One approach to solve the MSB toggling problem is to perform a common-mode level shift when the RF DAC signal swing is much less than full scale, and quiet the unused upper bits. Implementing a full adder at 2.7 GHz may either incur high current consumption or may even be impossible for a given process. In examples taught herein, a creative poor mans' adder with high-speed operation capability can be designed, which performs coarse addition steps corresponding to 6 dB digital attenuation resolution. The unused bit can be masked by logic controls (zero_enb) with 1b'0s settings to save the current (avoid current consumption) and nullify the switching glitch introduced noise energy. One MSB of the effective bits may be inverted with another control having 1b'1 setting (inv_en) to implement the signal common-mode level shifting. The multiple-bit controls (zero_enb and inv_en) can be used to make the design compatible for different attenuation settings.

Figure 6A:
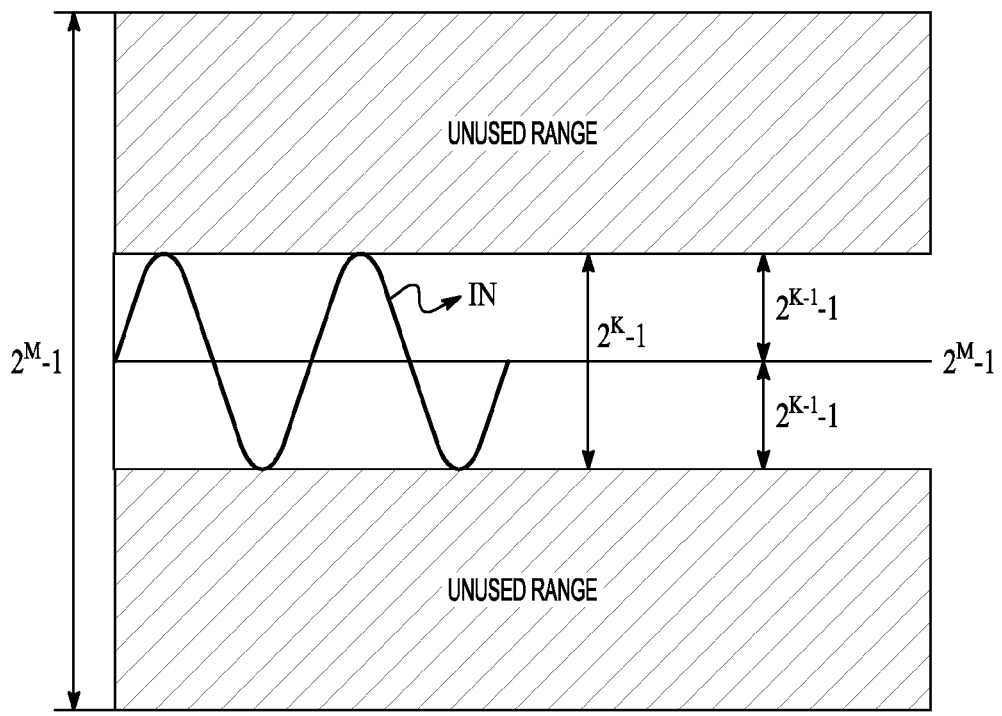
FIGS. 6A-6C illustrate shift procedures to transfer a digital signal by quiet operation in accordance with some embodiments.
Figure 6B:
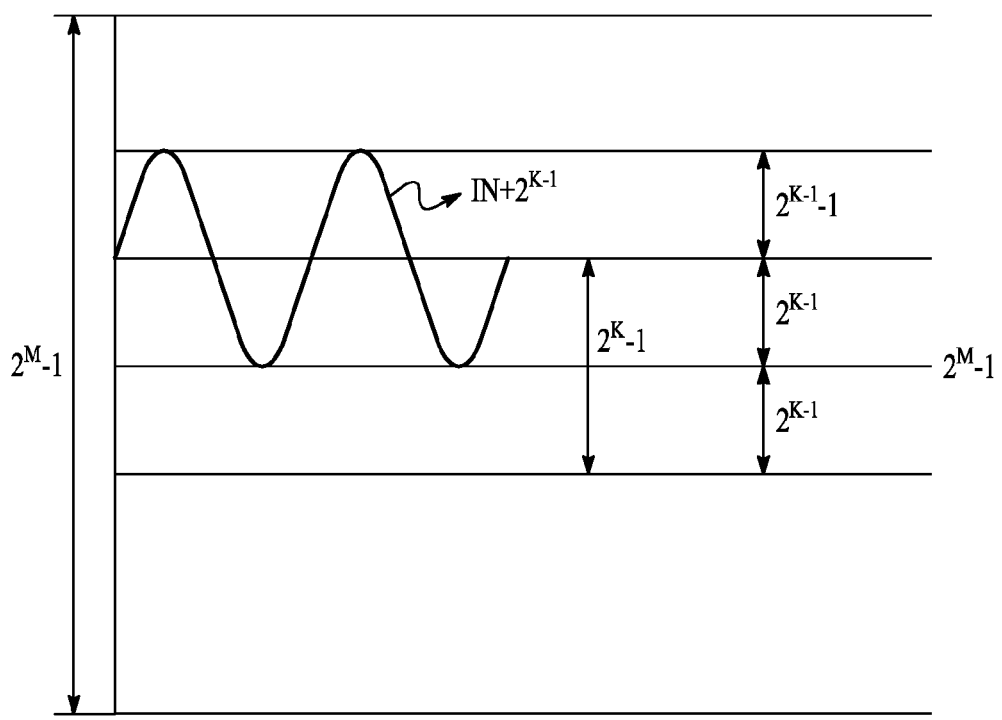
Figure 6C:
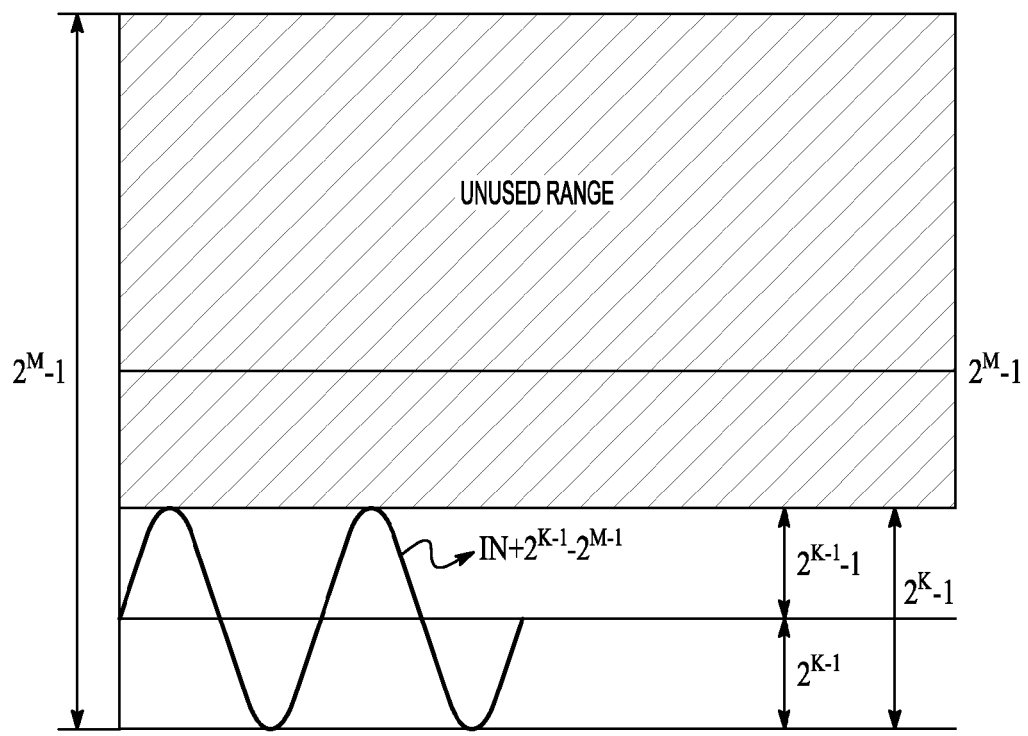
Figures 7A, 7B:
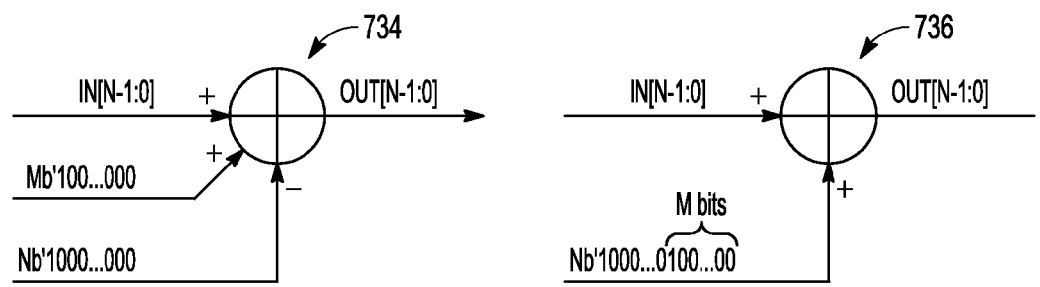
FIGS. 7A-B shows general implementations that can be associated with the shift of FIGS. 6A-6C in accordance with some embodiments.

If the up converted, unsigned binary data has a smaller range than the full range, the digital signal can be transferred by the quiet operation as shown in the shift procedures of FIGS. 6A-6C. In these figures, the effective range is $2^1K−1$, the full range is $2^M−1$, and the common point is $2^{M−1}$. FIG. 7A shows a general implementation for the shift of FIGS. 6A-6C. FIG. 7B shows a simplified implementation for the shift. Note that the nomenclature N−1:0 means BIT0 to BIT(N−1). The adder 736 in FIG. 7B can be reduced to two inputs from the three inputs of the adder 734 in FIG. 7A by combining M and N bits as a sequence at one of the inputs rather than separately applying the M bits and N bits at two inputs.

Figure 8A:
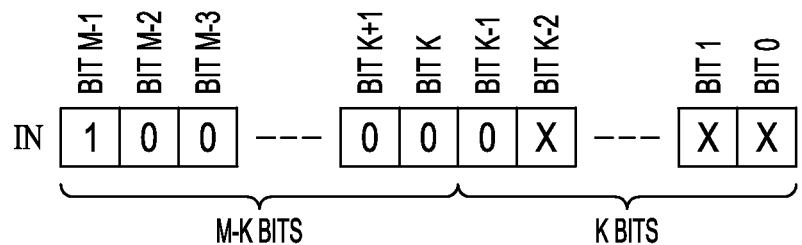
FIGS. 8A-8D illustrate another implementation of the level shift operation of FIGS. 7A-7B in accordance with some embodiments.
Figure 8B:
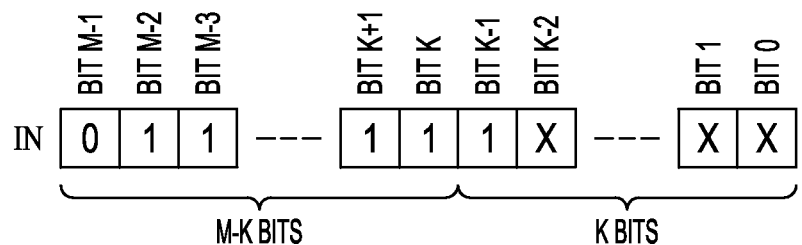
Figure 8C:
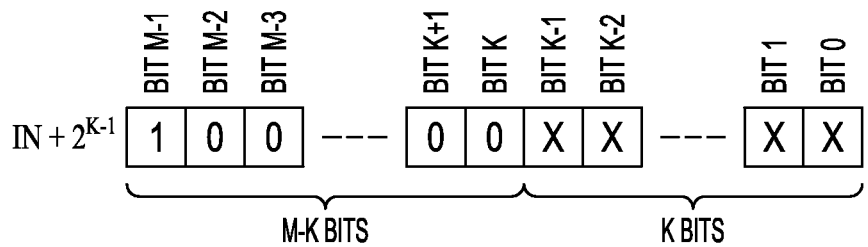
Figure 8D:
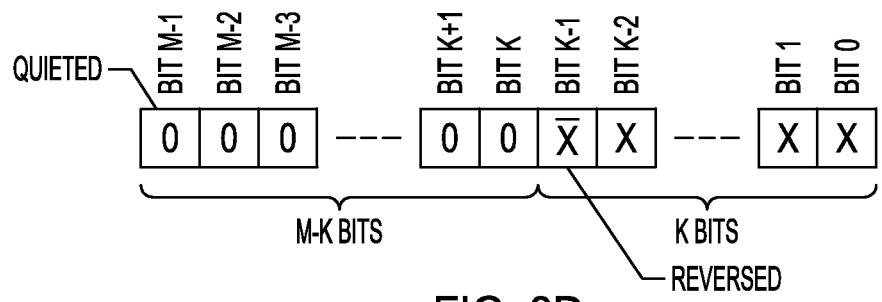

FIGS. 8A-8D illustrate another implementation of the level shift operation of FIGS. 7A-7B. The input data swings around $2^{M-1}$, which is the common-mode DC value of the input data. If the binary input data, IN, is larger than or equal to $2^{M-1}$, it has the format shown in FIG. 8A. If the data is smaller than $2^{M-1}$, it is showed in FIG. 8B. In both cases, the IN+$2^{K-1}$ has the same format as shown in FIG. 8C. After subtraction by $2^{M-1}$, one arrives at the format shown as FIG. 8D, which implements the shift operation described with respect to FIGS. 7A-7B. To summarize, the level shift operation for the input range smaller than $2^K$ can be realized by operations to zero the first M-K bits and reverse the $K^{th}$ bit. The same method is also valid for level shift operation of 2's complement binary format.

Figure 9A:
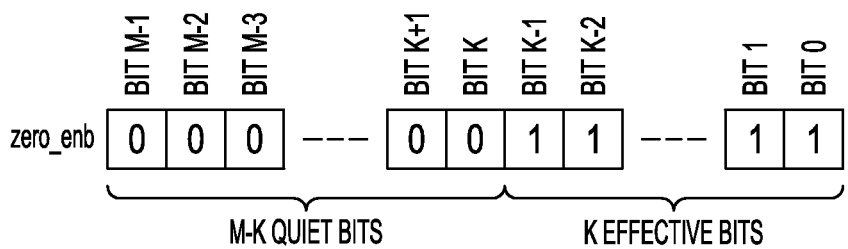
FIGS. 9A-9C illustrate generation of controls to enable zeroing of bits and to enable inversion of bits in accordance with some embodiments.
Figure 9B:
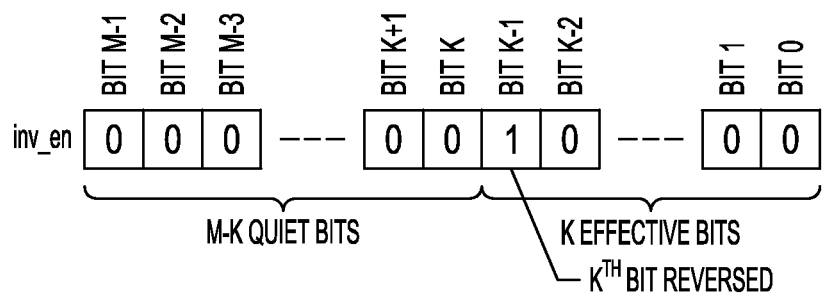
Figure 9C:
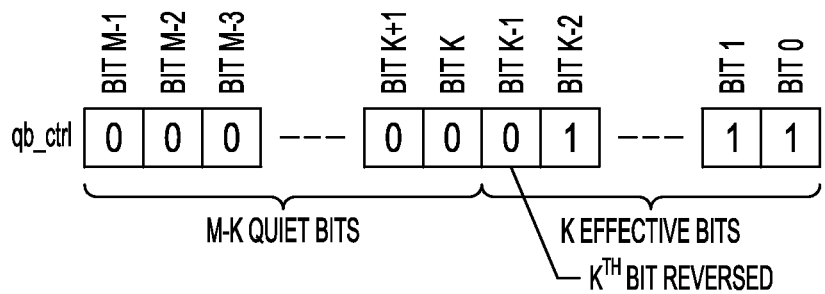

FIGS. 9A-9C illustrate generation of controls to enable zeroing of bits and to enable inversion of bits. For example, if the peak amplitude of the baseband signal occupies K effective bits, the zero_enb[K-1:0] (total K bits) is set to all 1s, and the zero_enb[M-1, K] is set to all 0s to quiet the M-K bits of non-effective bits, as shown in FIG. 9A. As shown in FIG. 9B, for the inv_en controls, the $K^{th}$ bit is set to logic 1 (inv_en[K-1]=1b'1) and all other bits are zero, which means the highest effective bit was reversed and the 2's complement code transferred to unsigned binary code for the effective K-bit data. To generate the zero_enb and inv_en controls, the qb_ctrl controls are introduced. The qb_ctrl is used to generate these two controls to save the control bus bit width from the digital control block to the HS DSP FE block. The rules for the qb_ctrl can include the highest effective bit being set to logic 0, and the other effective bits being set to logic 1s. The non-effective bits are all logic 0s, as shown in FIG. 9B. The generation of inv_en and zero_enb is:

zero_enb[M:0]={qb_ctrl[M-1:0]<<1,1b'1};

inv_en[M-1:0]=qb[M-1:0]^zero_enb[M-1:0].

Consider digital mixing for a hybrid thermometer/binary code. To reduce the data glitch energy and avoid huge bit width operation, the hybrid thermometer/binary code may be used for the HS DSP output. The input baseband data to the HS DSP can be split into two parts. The higher N bits can be transferred to thermometer code (total $T=2^N-1$ bits) by a binary to thermometer code coder and the lower M bits can be kept in binary code. The upper T-bit thermometer code can adapt the ROIB mixing method and the lower M bit can adapt the XOR mixing method.

Figure 10:
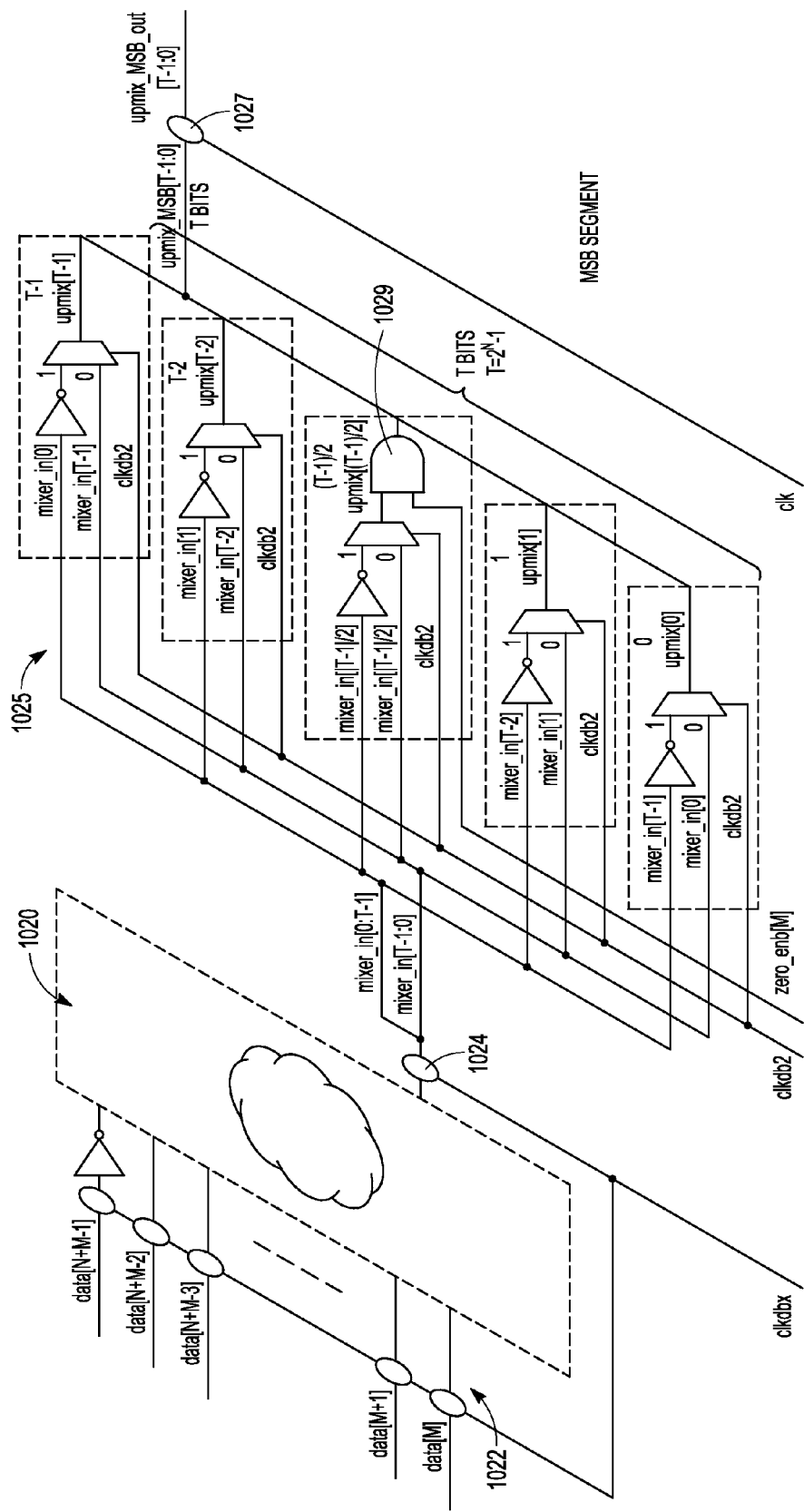
FIG. 10 shows reverse order inverted bit mixing for the upper section of input baseband binary bits in accordance with some embodiments.

FIG. 10 shows ROIB mixing for the upper section (MSB segment) using a binary to thermometer coder 1020 and a ROIB mixer 1025 with self-quieting for thermometer coded data. As shown in FIG. 10, the input baseband data is data[N+M-1:0], which is a N+M bit 2's complement code. The upper N bits will be transferred to the thermometer code and then mixed with clk_lo signal. The lower M bit will be kept in binary code and then mixed with clk_lo signal in a XOR method. First, an input register 1022 can latch the upper N bits of the input baseband data. The clock used for the input registers is clkdbX, which is the clk divided by X, where X is an integer and X is an integer power of 2, such as 2, 4, 8, etc). The MSB of the input latched baseband data (data[N+M-1]) can be reversed to transfer the input 2's complement binary code to unsigned binary code. The unsigned binary code (N bits) connected to the B/T coder. The output of the B/T coder (total $T=2^N-1$ bits) can be retimed by the registers 1024 with the clkdbX clock. The retimed data is input to the ROIB mixer 1025 and is mixed with the clk_lo signal. The output of the ROIB mixer 1025 can be retimed by the output registers 1027 with the clk clock. The frequency of the clk signal is double that of the clk_lo frequency.

For the ROIB mixing, because the total number of bits, T, is an odd number, the center bit of the thermometer code was never quieted, even the input peak has the effective bit smaller than M. In other words, even if the upper N bits of the input baseband signal are all non-effective, the center bit (the (T+1)/2 bit) of the thermometer code after mixing is still active. To quiet this bit to save current (limit current consumption), an extra AND gate 1029 can be put after the RB mux. This extra control for this AND gate can be generated by the lower M bit mixing as shown in FIG. 10.

Figure 11:
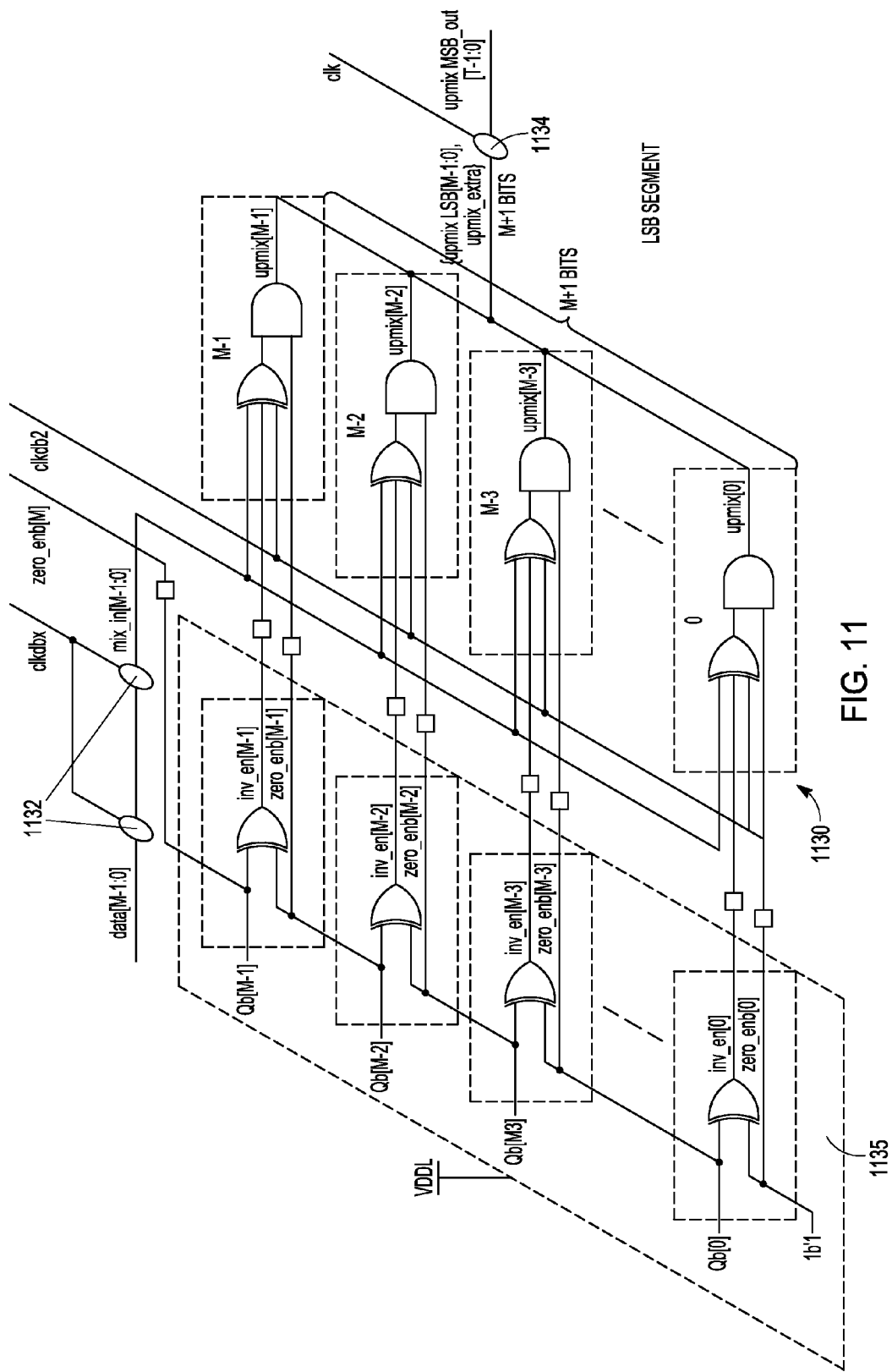
FIG. 11 shows exclusive-or mixing for the lower bits of input baseband binary bits and the generation of control signals in accordance with some embodiments.

FIG. 11 shows XOR mixing for the lower bits of input baseband binary bits and the generation of control signals. In FIG. 11, the lower M bits of the input baseband data may be double retimed by the registers 1132, which may be aligned to the delay in the MSB segment due to the B/T coder 1020 of FIG. 10. After the delay, the data goes to the XOR mixer 1130. Mixer 1130 provides XOR mixing with quiet controls for binary data. After mixing with the clk_lo, the mixed data can be latched by the output register 1134 with the clk clock. The controls generation block 1135, which generates zero_enb and inv_en, is also shown in FIG. 11. Control signal generation block 1135 does not require high speed operation. To save current, control block 1135 can use a high threshold voltage (high VT) device and lower power supply, VDDL. To boost the speed for the mixer, the XOR mixer, and the ROIB mixer for the upper N bit, the qb_ctrl[M-1] goes to the level shifter and becomes the quiet control of the center bits of the ROIB mixer (zero_enb[M]).

Figure 12:
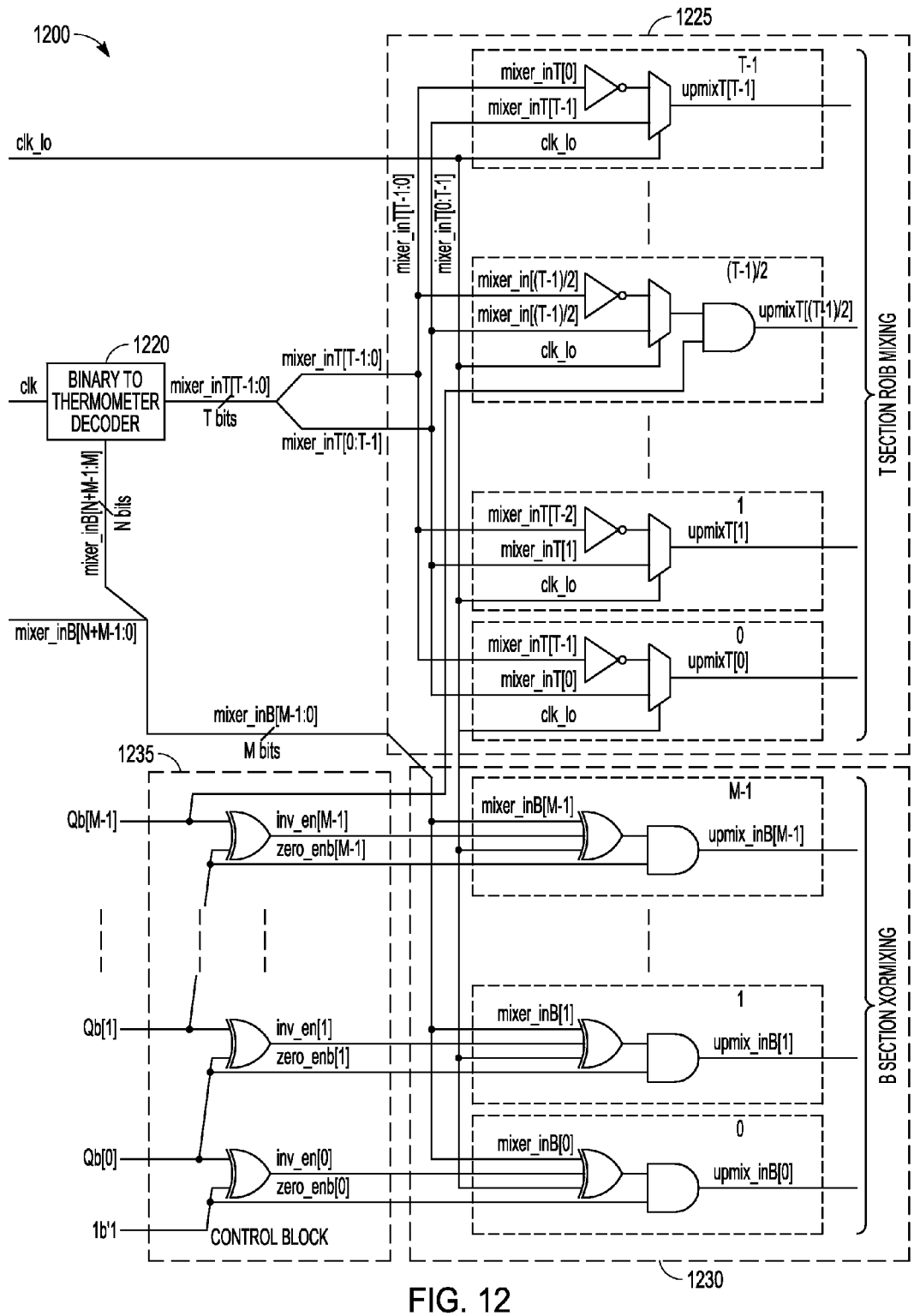
FIG. 12 illustrates a top level diagram of an example hybrid code mixing in accordance with some embodiments.

FIG. 12 illustrates a top level block diagram of an example hybrid code mixing. A hybrid code mixing configuration 1200 may be configured to receive N+M binary bits, which may have an input order of binary bits of mixer_inB[N+M-1:0] that can be separated into a set, mixer_inB[N+M-1:M] of N bits, and another set, mixer_inB[M-1:0] of M bits. Hybrid code mixing configuration 1200 may include a binary to thermometer coder 1220 to receive and operate on the set of N bits. Binary to thermometer coder 1220 may be coupled to a T section for ROIB mixing 1225. Hybrid code mixing configuration 1200 may include a binary section for XOR mixing 1230 and a control block 1235 to operatively receive quiet bits associated with the M bits and provide control signals to binary section for XOR mixing 1230. Control block 1235 may be coupled to a center mux section to provide a quiet bit for control. Binary to thermometer coder 1220, mixer 1225 to mix the bits of the thermometer code from the binary to thermometer coder 1220, control block 1235, and the exclusive-or circuitry 1230 to mix input binary bits that are not sent to the binary to thermometer coder 1220 may be realized in a manner similar to or identical to the structures taught with respect to FIGS. 1-11.

Figure 13A:
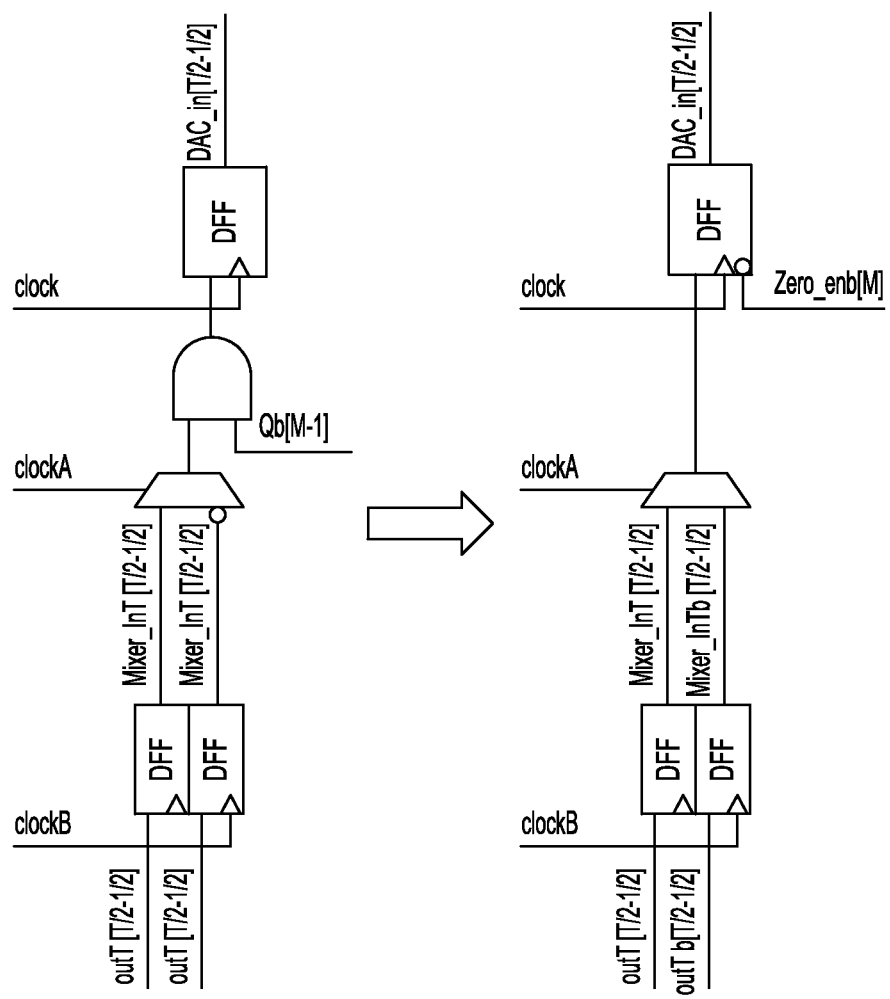
FIGS. 13A-13B illustrate simplification of components for reverse order inverted bit mixing in accordance with some embodiments.

Simplification and optimization can be implemented to boost the speed and reduce current. To further simplify the logic operations to boost the speed and reduce current consumptions, the ROIB mux can be simplified as shown in FIG. 13A. For the center of the T code ROIB mixing, the output of the ROIB MUX can be masked by the Qb[M-1] (zero_enb[M]) using a AND gate. The output of the AND gate can be retimed by the output D flip-flop (DFF). The AND gate and the DFF can be combined into a DFF with a reset input, which is controlled by the Qb[M-1]. For the input of the IB MUX, the data input can be Mixer_inT [T/2-1/2] and one of these two inputs can be inverted by a NOT gate. The NOT gate can be moved before the input DFF.

Figure 13B:
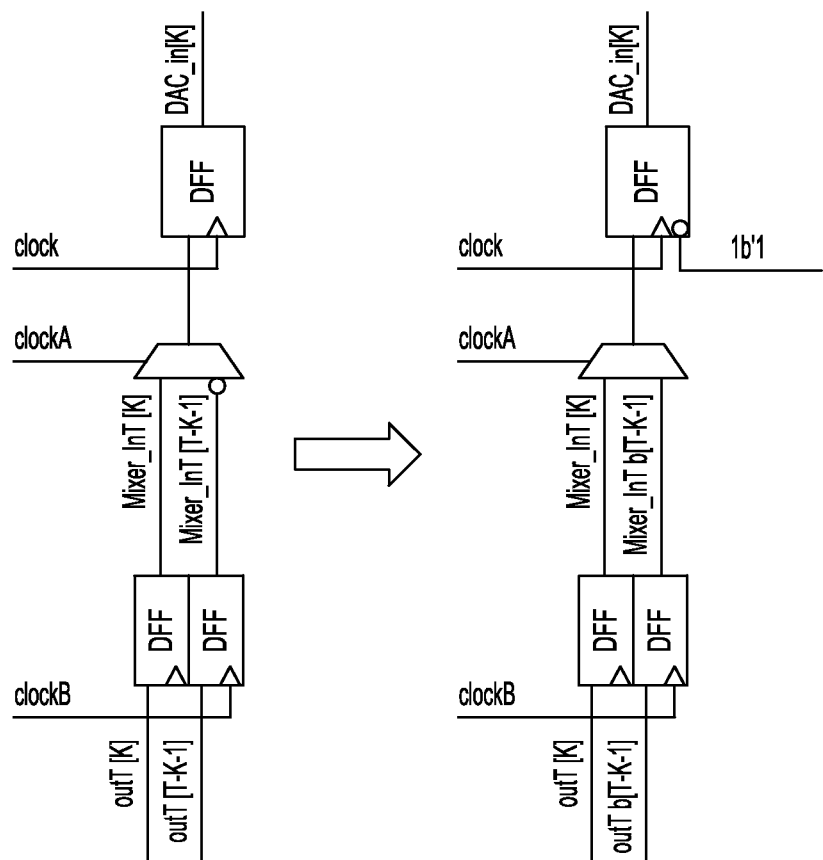

For other T code ROIB mixing (except the center of the T code), the inverter of the ROIB MUX can be moved before the input DFF. This simplification may have two benefits. First, the operation clock rate of the MUX is at least double of the operation clock (P times), and moving the inverter before the DFF may reduce current and reduce the number of operation gates in high-speed mixing stage (ROIB mixing). Secondly, it avoids the bus cross routing (due to the RO) at the high-speed mixing stage in the physical layout, which reduces the parasitics of the bus. For example, the LSB of the input—mixer_inT[0] does not need to route to both the 0 unit and the T−1 unit, which cross the whole section of the T-code ROIB mixing. To match the output of the T-code mixing DFF, the non-center T-code output DFF is the same as the DFF used for the center of the T-code. It is the one with reset bit, which was tied to logic 1, as shown in FIG. 13B.

Figure 14:
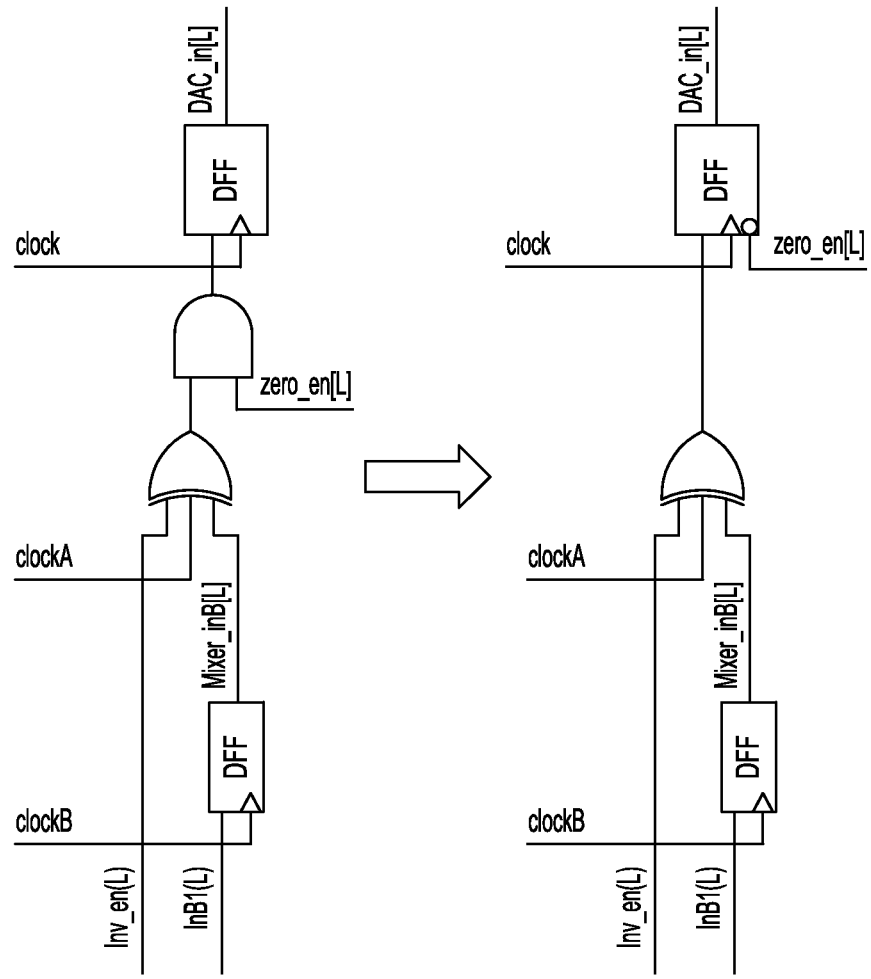
FIG. 14 illustrates simplification of components for exclusive-or mixing in accordance with some embodiments.

FIG. 14 shows a simplification of XOR mixing. For the XOR mixing of the binary-section, a mask AND gate can be combined with the output DFF into a DFF with reset bit, as shown in FIG. 14.

Figure 15:
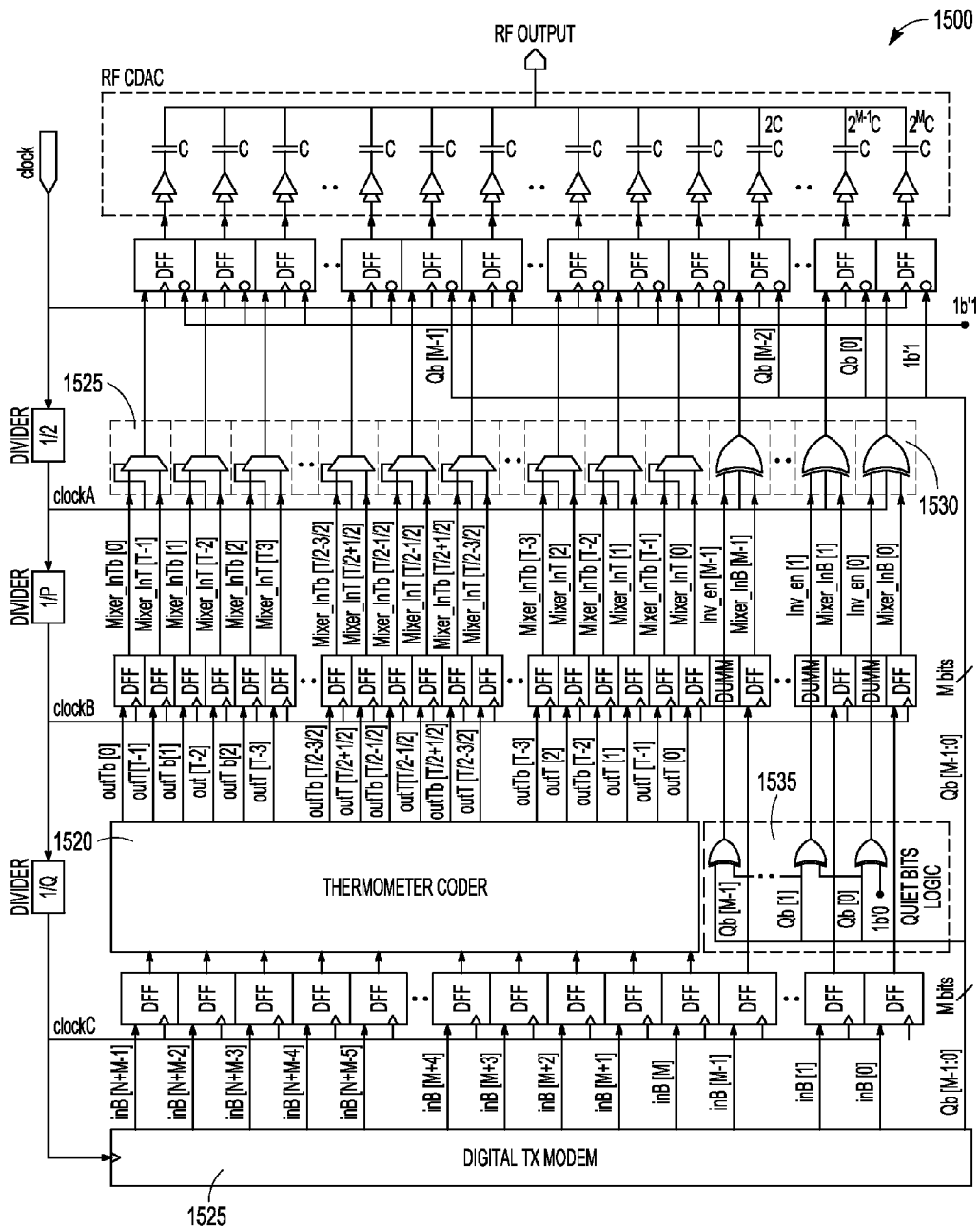
FIG. 15 illustrates a block diagram that can be associated with layout considerations for a high speed digital signal processor in accordance with some embodiments.

FIG. 15 illustrates a block diagram that can be associated with layout considerations for a high speed digital signal processor 1500. The frequency of the input clock may be double of that of the LO. The input clock may feed into the clock inputs of the mixing output DFF. All these DFF may have the reset input, where the center of the T-code (T/2−1/2 th bit of the T-code) mixing output DFF may have the reset connected to the Qb[M−1] (=zero_enb[M]). The other DFF of the mixed T-code output may have the reset input pin connected to the logic 1. The DFF of the mixed binary code (B-code) output may have the reset pins connected to zero_enb[M−1:0] (={Qb[M−2:0],1b'1}). Therefore, all the B-code output DFF and the T-code output DFF may be identical design. In the HS DSP layout, they may be aligned and placed in the first row. The set of DFF components in the different rows shown in FIG. 15 may operate as latches and registers similar to the latches and registers of the different sections of a high speed digital signal processor as taught herein with respect to the previous figures, for example, FIGS. 10-12.

The mixing MUX for T-code and the mixing XOR gate for B-code are aligned and place in a second row layout. The layout width of the MUX and the XOR gate may be made the same and identical to the DFF of the first row. The clock can be divided by 2, forming the LO signal (clockA), which may feed into the blocks in the second row XOR gates for B-code mixing or MUX for T-code mixing. The MUX or XOR input data may be retimed by the input DFF. The clockA may be divided by P (P is positive integer) using the frequency divider (clockB) and feeding the input DFF. The K-th MUX corresponds to two input DFFs, one DFF output can be Mixer_inT[K] and the other DFF output can be Mixer_inTb[T−K−1]. The signal Mixer_inTb[T−K−1] can be the inverted signal of the Mixer_inT[T−K−1]. By switching between the Mixer_inT[K] and the Mixer_inTb[T−K−1] with clockA, the ROIB mixing operation may be conducted by the K-th MUX. The XOR corresponds to only one input DFF. In the layout, a dummy input DFF may be placed for each XOR input. The layout of the input DFF may be half of the width of output DPI'. All the input DFF may be aligned and placed in a third row. There are 2*M+T input DFFs, including M dummy DFF.

High speed digital signal processor 1500 may receive N+M binary bits from a digital Tx modem 1525. The binary-to-thermometer code coding can be performed by a thermometer coder block 1520. The block may have N bit binary input and 2*T (=2*($2^N$−1)) bits output, which may be arranged as outT[T−1:0] and outTb[T−1:0], where a bit location in the Tb order is reversed from the corresponding bit location in the T order. The bit reversing (RB) operation may not be performed in the second row, which provides a configuration to avoid the bus crossing in the high speed mixing section. The bus crossing in the layout of the high-speed mixing section (second row) can introduce extra parasitics and reduce the circuit speed. The thermometer coder output may be in the order of outTb[0], outT[T−1], outTb[1], outT[T−2], . . . , outTb[K], outT[T−K−1], . . . , outTb[T−1], outT[0].

The quiet bits can be generated by the Quite bit logic 1535. The output inv_en[M−1:0] can be connected to the M XOR gates 1530 in the second row. The output zero_enb[M:0] (={Qb_en[M−1:0],1b'1}) can be connected to the output DFF reset pins, wherein, the zero_enb[M] can connect the center of the T-code output DFF (the T/2−1/2 th in the T code output DFFs), and the zero_enb[M−1:0] can connected to the M B-code output DFF.

The layout width of the thermometer code coder can have the same width of the total width of the layout width of the MUX in the second row (also equal to the total layout width of the 2*T input DFF corresponding to the T MUXs). The layout width of the quiet bit logic can be the same as the layout width of the XOR in the second row (also equal to the total layout width of the M input DFF and M input dummy DFF corresponding to the XORs). The layout of the thermometer code coder and the quiet bit logic form the forth row of the layout.

The clockB can be divided by Q (positive integer) and feed input to the digital TX modem 1525, which may provide the baseband digital signal (N+M bits) to be modulated. All the data (inB [N+M−1:0]) from the TX modem 1525 may be retimed by the DFF and the lower M bits may be directly fed into the DFF at the third row. The upper N bits can be connected to the thermometer coding.

A layout may be designed similar to or identical to the diagram shown in FIG. 15. The high speed core (HSC) may include the IB mux (one for each bit of the T-code) and the XOR with quiet control unit (one for each bit of the B-code). The HSC may mix the hybrid T/B code with LO clock and provide a high rate hybrid T/B output (clock=2*clockA). The data path low speed section may be separated from the HSC and located at the low speed core (LSC). The LSC may include the B/T coder 1520 for the thermometer code generation and the bit re-ordering. The HSC and LSC blocks together may be the core block for the data path.

Figure 16:
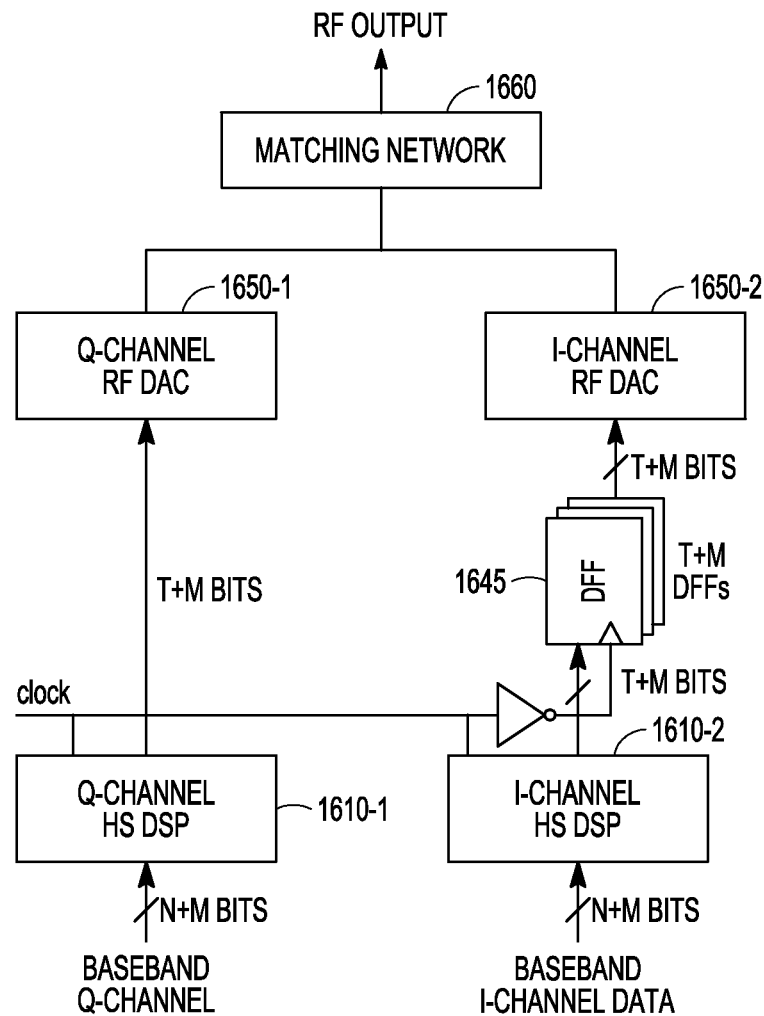
FIG. 16 shows a block diagram of an example of Cartesian modulation in accordance with some embodiments.

FIG. 16 shows a block diagram of an example of Cartesian modulation. For a general Cartesian TX modulator, the quadrature signal can be generated by the baseband modem providing a baseband Q-channel with N+M bits and a baseband I-channel with N+M bits. There may be two sets of HS DSP and DAC: Q-channel HS DSP 1610-1 driving Q-channel RF DAC 1650-1 and I-channel HS DSP 1610-2 driving I-channel RF DAC 1650-2. These two sets may have a design similar to or identical to the design of HS DSPs taught herein. The difference for these two sets may include the baseband input of the I-Channel HS DSP connected to a baseband modem I-channel output, and the baseband input of the Q-Channel HS DSP connected to a baseband modem Q-channel output. Q-channel HS DSP 1610-1 may be coupled Q-channel RF DAC 1650-1, while output from I-channel HS DSP 1610-2 may be re-timed by the DFF 1645 with inverted clock to make sure that the I-channel data has 90 degree phase shift in terms of the LO clock, compared to Q-channel data. The rate of the clock is double of the LO clock. The output of the I/Q RF DACs (Q-channel RF DAC 1650-1 and I-channel RF DAC 1650-2) may be connected together. The combined RF signal may feed as input to a matching network 1660 that provides an RF output.

Figure 17:
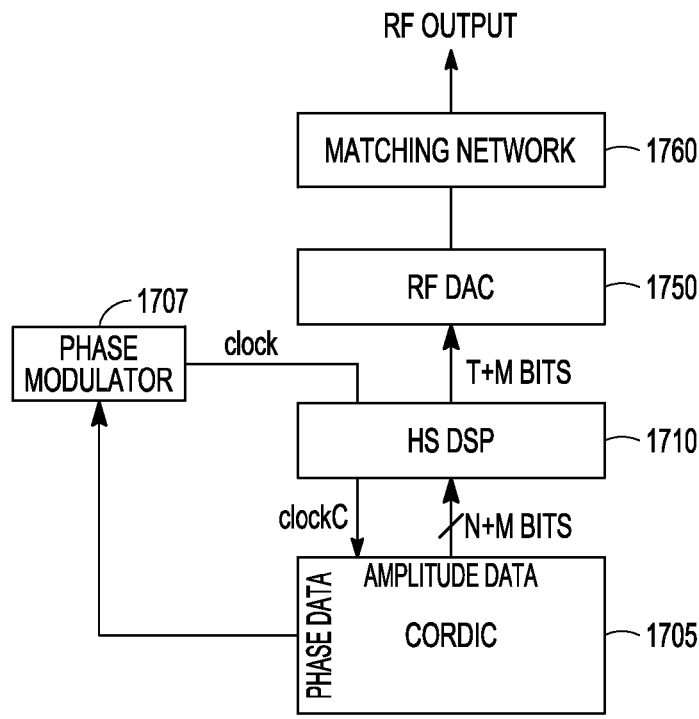
FIG. 17 shows a block diagram of an example of polar modulation in accordance with some embodiments.

FIG. 17 shows a block diagram of an example of polar modulation. For polar modulations, the clock from the phase locked loop already contains the phase modulation information. The baseband input may contain the amplitude information. In this example, the configuration may include only one HS DSP. Data can be input to a coordinate rotation digital computer (CORDIC) 1705. CORDIC 1705 can transmit N+M bits of amplitude data to HS DSP 1710. CORDIC 1705 can also output phase data to phase modulator 1707, which can provide a clock signal to HS DSP 1710, which in turn can provide another clock to CORDIC 1705. HS DSP 1710 may output T+M bits to a RF DAC 1750 that may be coupled to a matching network 1760 to provide an RF output.

Figure 18:
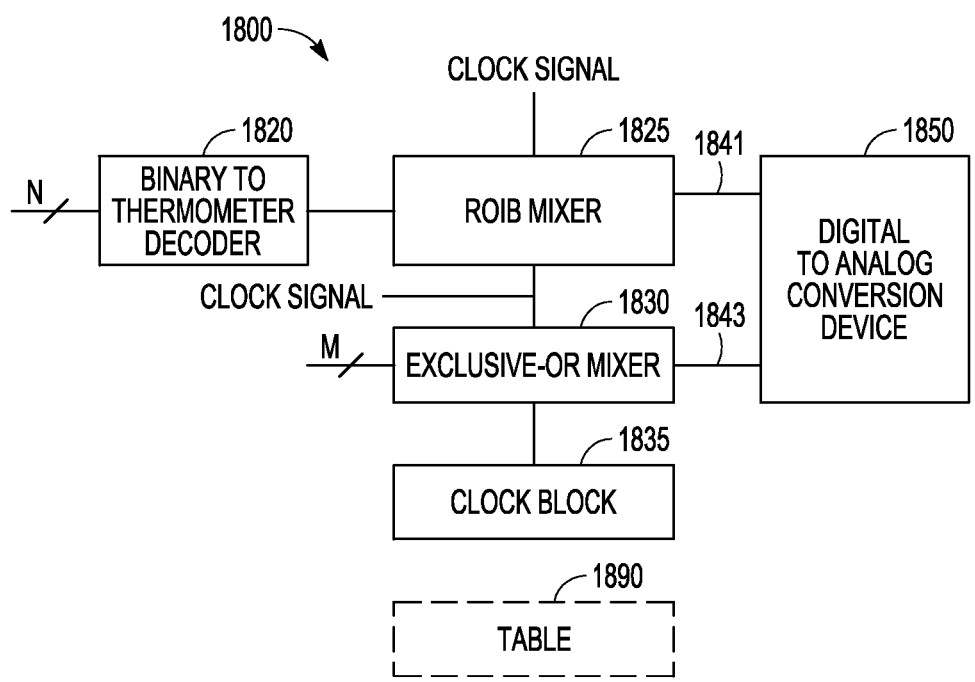
FIG. 18 shows a block diagram of an example digital signal processor configured to provide data to drive a digital device in accordance with some embodiments.

FIG. 18 shows a block diagram of an example digital signal processor 1800 configured to provide data to drive a digital to analog conversion device 1850. Digital signal processor 1800 may comprise a binary to thermometer coder 1820 having inputs to receive N binary bits of an input baseband signal. The input baseband signal may include M binary bits in addition to the N binary bits, where N and M are integers. Binary to thermometer coder 1820 may be configured to output bits corresponding to a thermometer code. Digital signal processor 1800 also may comprise a mixer 1825 and exclusive-or circuitry 1830. Mixer 1825 may be configured to mix the bits of the thermometer code with a local oscillator clock signal to operatively provide a reverse order invert bit pattern. Exclusive-or circuitry 1830 may be configured to mix the M binary bits with the local oscillator clock signal. Digital signal processor 1800 may output lines 1841 and 1843 from mixer 1825 and exclusive-or circuitry 1830 to feed a mixed hybrid code to digital device 1850. Each of the output lines 1841 and 1843 may be a plurality of connections to couple to digital device 1850.

The thermometer code from thermometer coder 1820 has a number of bits and mixer 1825 may include a number of multiplexers equal in number to the number of bits of the thermometer code. Each multiplexer may configured to receive the local oscillator clock signal and two bits of the thermometer code, with each of the two bits being from an order of bit locations of the thermometer code such that bit locations of the two bits are equally spaced apart from opposite ends of the order and such that one of the two bits being inverted. Mixer 1825 may include a AND gate coupled to an output of one of the multiplexers, where the one multiplexer is disposed to operate with respect to a center location of the order such that the two bits are from the same bit location. The AND gate may include an input to receive a bit signal from a control block 1835 of digital signal processor 1800 in addition to an input to receive the output of the one multiplexer.

Digital signal processor 1800 may include a plurality of D flip-flops (DFFs), where each DFF is coupled to a different one of the multiplexers of mixer 1825 to receive an output signal from the respective multiplexer as an input, where each DFF is configured to operate with respect to an inverted logic one at an input of the DFF and each DFF is configured to receive the local oscillator clock signal received at another input.

Exclusive-or circuitry 1830 may include a plurality of exclusive-or gates, each exclusive-or gate having three inputs, one input configured to receive one of the M bits, one input of the three inputs configured to receive the local oscillator clock signal, and one input of the three inputs configured to receive an invert enable signal from a control block of digital signal processor 1800. For each of the plurality of exclusive-or gates, exclusive-or circuitry 1830 may include an AND gate having an input coupled to an output of the respective exclusive-or gate and configured to receive a zero enable signal. Digital signal processor 1800 may include a plurality of DFFs, where each DFF is coupled to a different one of the exclusive-or gates to receive an output signal from the respective exclusive-or gate as an input, and each DFF is configured to operate with respect to an associated inverted quiet bit and to receive the local oscillator clock signal.

Digital signal processor 1800 may include control block 1835 having quiet bit logic to generate input to exclusive-or circuitry 1830, the quiet bit logic configured to receive M quiet bits. Digital signal processor may include access to a table 1890 configured as a source for the M quiet bits received by the control block 1835.

The configuration of the various components of digital signal processor 1800 may be realized by structures as taught with respect to FIGS. 1-17. Variations in the structure can be made in accordance with an application of digital signal processor 1800.

Figure 19:
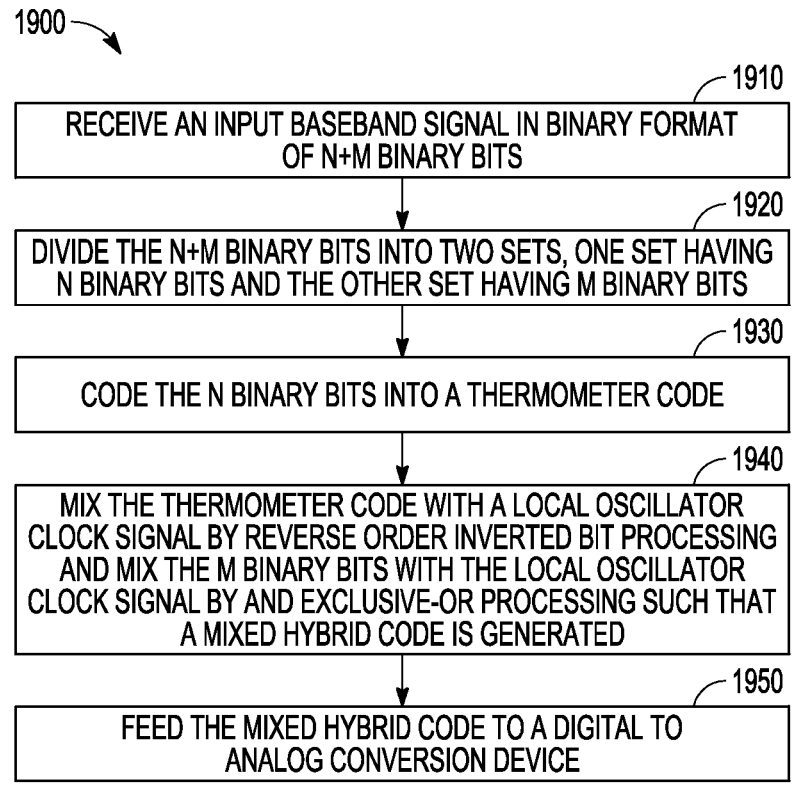
FIG. 19 shows features of an example method of operating a digital signal processor in accordance with some embodiments.

FIG. 19 shows features of an example method 1900 of operating a digital signal processor. At 1910, an input baseband signal is received in binary format of N+M binary bits, where N and M positive integers. At 1920, the N+M binary bits are divided into two sets, one set having N binary bits and the other set having M binary bits. The N binary bits may be an upper set of bits of the N+M binary bits and the M binary bits may be a lower set of bits below the N+M binary bits. At 1930, the N binary bits are coded into a thermometer code. The coding may be conducted using a binary-to-thermometer coder. At 1940, the thermometer code is mixed with a local oscillator clock signal by reverse order reverse bit processing and the M binary bits is mixed with the local oscillator clock signal by an exclusive-or processing such that a mixed hybrid code is generated. Mixing the thermometer code with the local oscillator clock signal may include inputting two bits of the thermometer code into a multiplexer, each of the two bits being from an order of bit locations of the thermometer code such that bit locations of the two bits are equally spaced apart from opposite ends of the order and such that one of the two bits being inverted; and inputting the local oscillator clock signal into the multiplexer. Mixing the thermometer code with the local oscillator clock signal may include inputting two bits of the thermometer code into a center multiplexer, the center multiplexer disposed to operate with respect to a center location of the order such that the two bits are from the same bit location.

At 1950, the mixed hybrid code is fed to a digital device. Feeding the mixed hybrid code to the digital device may include feeding the mixed hybrid code to a digital to analog converter, digital power amplifier, or digital drive amplifier.

Method 1900 or a similar method may include performing a common-mode level shift for signals feed to a radio frequency digital to analog converter (RF DAC) when a RF DAC signal swing is substantially less than full scale. Method 1900 or a similar method may include performing a common-mode level shift to de-activate upper bits such that the de-activated upper bits do not toggle between a logic one and a logic zero over a clock signal. A common-mode level shift may include: ordering the M bits from bit 0 to bit K followed by bit K+1 to bit M−1, K being the number of active bits, an active bit being a one-bit signal that is dynamically changing at a given digital attenuation; zeroing the bits at bit K to bit M−1; and reversing the bit at bit K−1.

Method 1900 or a similar method may include quieting output of the center multiplexer. Quieting output of the center multiplexer may include inputting a quiet bit to a D Flip-Flop having the output of the center multiplexer as an input.

Figure 20:
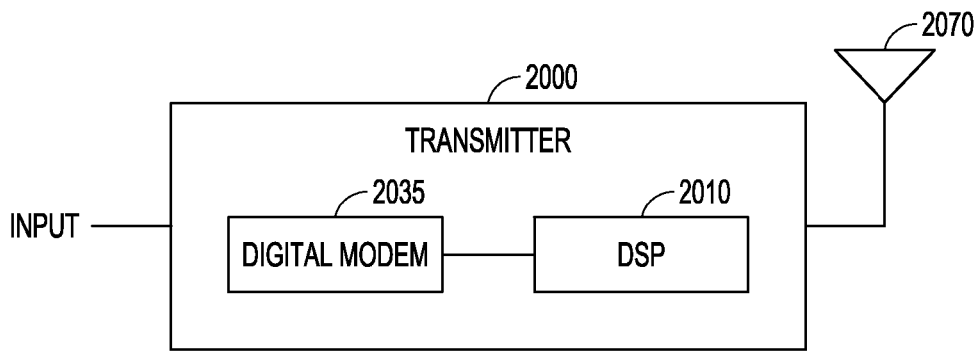
FIG. 20 is a schematic block diagram of a transmitter in accordance with some embodiments.

FIG. 20 is a schematic block diagram of a transmitter 2000. Transmitter 2000 may include a digital modem 2035 to receive a data input and to provide binary bits to a DSP 2010. DSP 2010 may be realized as a HS DSP as taught herein. Digital modem 2035 can be configured as a source of binary bits to couple to DSP 2010. DSP 2010 may include: a binary to thermometer coder having inputs to receive N binary bits of N+M binary bits from the source, N and M being integers, the binary to thermometer coder configured to output bits corresponding to a thermometer code; a mixer to mix the bits output from the thermometer code with a local oscillator clock signal to operatively provide a reverse order reverse bit pattern; exclusive-or circuitry configured to mix the M binary bits with the local oscillator clock signal; and output lines from the mixer and the exclusive-or circuitry to feed a mixed hybrid code from the digital signal processor. Digital modem 2035 to receive a data input and to provide binary bits to a DSP 2010 may be structured similar to or identical to the layout for high speed digital signal processor 1500 as shown in FIG. 15. Transmitter 2000 may be configured with an antenna 2070 coupled to the transmitter.

In an example 1, a digital signal processor may comprise: a binary to thermometer coder having inputs to receive N binary bits of an input baseband signal, the input baseband signal including M binary bits in addition to the N binary bits, N and M being integers, the binary to thermometer coder configured to output bits corresponding to a thermometer code; a mixer to mix the bits of the thermometer code with a local oscillator clock signal to operatively provide a reverse order inverted bit pattern; exclusive-or circuitry configured to mix the M binary bits with the local oscillator clock signal; and output lines from the mixer and the exclusive-or circuitry to feed a mixed hybrid code to a digital to analog conversion device.

In an example 2, the subject matter of example 1 may include the thermometer code having a number of bits and the mixer may include a number of multiplexers equal in number to the number of bits of the thermometer code, each multiplexer configured to receive the local oscillator clock signal and two bits of the thermometer code, each of the two bits being from an order of bit locations of the thermometer code such that bit locations of the two bits are equally spaced apart from opposite ends of the order and such that one of the two bits being inverted.

In an example 3, the subject matter of example 2 may include the mixer including an AND gate coupled to an output of one of the multiplexers, the one multiplexer disposed to operate with respect to a center location of the order such that the two bits are from the same bit location.

In an example 4, the subject matter of example 3 may include the AND gate including an input to receive a bit signal from a control block of the digital signal processor in addition to an input to receive the output of the one multiplexer.

In an example 5, the subject matter of example 2 may include the digital signal processor including a plurality of D flip-flops (DFFs), each DFF coupled to one of the multiplexers to receive an output signal from the respective multiplexer as an input, each DFF to operate with respect to an inverted logic one at an input of the DFF as a reset signal, each DFF configured to receive clock signal, which has clock rate double of the local oscillator clock signal.

In an example 6, the subject matter of any one of examples 1-5 may include the exclusive-or circuitry including a plurality of exclusive-or gates, each exclusive-or gate having three inputs, one input configured to receive one of the M bits, one input of the three inputs configured to receive the local oscillator clock signal, and one input of the three inputs configured to receive an invert enable signal from a control block of the digital signal processor.

In an example 7, the subject matter of example 6 may include the exclusive-or circuitry including, for each exclusive-or gate, an AND gate having an input coupled to an output of the exclusive-or gate and configured to receive a zero enable signal.

In an example 8, the subject matter of example 6 may include the digital signal processor including a plurality of D flip-flops (DFFs), each DFF coupled to a different one of the exclusive-or gates to receive an output signal from the respective exclusive-or gate as an input, each DFF to operate with respect to an associated inverted quiet bit as a reset, each DFF configured to receive the clock signal, which has clock rate double of the local oscillator clock signal.

In an example 9, the subject matter of any one of examples 1-8 may include the digital signal processor including a control block having quiet bit logic to generate input to the exclusive-or circuitry, the quiet bit logic configured to receive M quiet bits.

In an example 10, the subject matter of example 9 may include the digital signal processor including access to a table configured as a source for the M quiet bits received by the control block.

In an example 11, a digital system may comprise: a source of binary bits; a digital signal processor coupled to the source of binary bits, and a digital device coupled to the digital signal processor, the digital signal processor including: a binary to thermometer coder having inputs to receive N binary bits of N+M binary bits from the source, N and M being integers, the binary to thermometer coder configured to output bits corresponding to a thermometer code; a mixer to mix the bits output from the thermometer code with a local oscillator clock signal to operatively provide a reverse order reverse bit pattern; exclusive-or circuitry configured to mix the M binary bits with the local oscillator clock signal; and output lines from the mixer and the exclusive-or circuitry to feed a mixed hybrid code from the digital signal processor; such that the digital device is coupled to the output lines of the digital signal processor, the digital device configured to receive the mixed hybrid code.

In an example 12, the subject matter of example 11 may include the source of binary bits being a baseband modem configured to provide baseband Q-channel data and baseband I-channel data, the digital signal processor being a Q-channel digital signal processor and the digital device being a Q-channel radio frequency digital-to-analog converter (RF DAC), and the digital system including an I-channel digital signal processor configured to feed an I-channel RF DAC.

In an example 13, the subject matter of example 12 may include the digital system including a D flip-flop coupling the I-channel digital signal processor to the I-channel RF DAC, the D flip-flop having an input to receive a clock that is inverted from clock signal of the Q-channel digital signal processor operable with the I-channel digital signal processor.

In an example 14, the subject matter of example 11 may include the source of binary bits being a coordinate rotation digital computer (CORDIC) and the N+M binary bits being amplitude data.

In an example 15, the subject matter of example 14 may include the digital device including a radio frequency digital-to-analog converter (RF DAC) and the digital system including a phase modulator coupled to the CORDIC to receive phase data from the CORDIC and coupled to the digital signal processor to generate a clock signal to the digital signal processor.

In an example 16, a method of operating a digital signal processor may comprise: receiving an input baseband signal in binary format of N+M binary bits, N and M positive integers; dividing the N+M binary bits into two sets, one set having N binary bits and the other set having M binary bits; coding the N binary bits into a thermometer code using a binary-to-thermometer coder; mixing the thermometer code with a local oscillator clock signal by reverse order inverted bit processing and mixing the M binary bits with the local oscillator clock signal by an exclusive-or processing such that a mixed hybrid code is generated; and feeding the mixed hybrid code to a digital device.

In an example 17, the subject matter of example 16 may include feeding the mixed hybrid code to the digital to analog conversion device to include feeding the mixed hybrid code to a digital to analog converter, digital power amplifier, or digital drive amplifier.

In an example 18, the subject matter of any one of examples 16-17 may include the N binary bits being an upper set of bits of the N+M binary bits and the M binary bits being a lower set of bits below the N+M binary bits.

In an example 19, the subject matter of any one of examples 16-18 may include performing a common-mode level shift for signals feed to a radio frequency digital to analog converter (RF DAC) when a RF DAC signal swing is substantially less than full scale.

In an example 20, the subject matter of any one of examples 16-19 may include performing a common-mode level shift to de-activate upper bits such that the de-activated upper bits do not toggle between a logic one and a logic zero over a clock signal.

In an example 21, the subject matter of example 20 may include the common-mode level shift including: ordering the M bits from bit 0 to bit K followed by bit K+1 to bit M−1, K being the number of active bits, an active bit being a one-bit signal that is dynamically changing at a given digital attenuation; zeroing the bits at bit K to bit M−1; and reversing the bit at bit K−1.

In an example 22, the subject matter of any one of examples 16-21 may include mixing the thermometer code with the local oscillator clock signal to include: inputting two bits of the thermometer code into a multiplexer, each of the two bits being from an order of bit locations of the thermometer code such that bit locations of the two bits are equally spaced apart from opposite ends of the order and such that one of the two bits being inverted; and inputting the local oscillator clock signal into the multiplexer.

In an example 23, the subject matter of example 22 may include mixing the thermometer code with the local oscillator clock signal to include inputting two bits of the thermometer code into a center multiplexer, the center multiplexer disposed to operate with respect to a center location of the order such that the two bits are from the same bit location.

In an example 24, the subject matter of any one of examples 16-23 may include quieting output of the center multiplexer.

In an example 25, the subject matter of example 24 may include quieting output of the center multiplexer to include inputting a quiet bit to a D Flip-Flop having the output of the center multiplexer as an input.

In an example 26, a transmitter may comprise: a source of binary bits to receive an input signal and provide binary bits; and a digital signal processor coupled to the source of binary bits, the digital signal processor including: a binary to thermometer coder having inputs to receive N binary bits of N+M binary bits from the source, N and M being integers, the binary to thermometer coder configured to output bits corresponding to a thermometer code; a mixer to mix the bits output from the thermometer code with a local oscillator clock signal to operatively provide a reverse order inverted bit pattern; exclusive-or circuitry configured to mix the M binary bits with the local oscillator clock signal; and output lines from the mixer and the exclusive-or circuitry to feed a mixed hybrid code from the digital signal processor.

In an example 27, the subject matter of example 26 may include the source of binary bits being a baseband modem configured to provide baseband Q-channel data and baseband I-channel data, the digital signal processor being a Q-channel digital signal processor coupled to a Q-channel radio frequency digital-to-analog converter (RF DAC) via the output lines, and the transmitter includes an I-channel digital signal processor configured to feed an I-channel RF DAC.

In an example 28, the subject matter of example 27 may include the digital system including the transmitter including a D flip-flop coupling the I-channel digital signal processor to the I-channel RF DAC, the D flip-flop having an input to receive a clock that is inverted from the clock signal of the Q-channel digital signal processor operable with the I-channel digital signal processor.

In an example 29, the subject matter of example 26 may include the source of binary bits being a coordinate rotation digital computer (CORDIC) and the N+M binary bits being amplitude data.

In an example 30, the subject matter of example 29 may include the digital signal processor coupled to a radio frequency digital-to-analog converter (RF DAC) and the CORDIC coupled to a phase modulator to provide phase data to the phase modulator and the phase modulator being coupled to the digital signal processor to generate a clock signal to the digital signal processor.

In an example 31, the subject matter of any one of examples 26-30 may include the transmitter configured with an antenna coupled to the transmitter.

An all-digital transmitter is attractive for a wireless transceiver design. It may provide advantages that can include: (1) scalability with the scaling trend of advanced CMOS fabrication; (2) area saving (digital filter, no capacitor/inductor needed); (3) easy bandwidth controls (digital filters); (4) High linearity and small performance variation over pressure, volume, and temperature (PVT). The structures and architectures taught herein may provide a general solution for a DSP of the all-digital transmitter. Digital transmitters using such structures and architectures may be suitable for cellular communications including communications in accordance with one of the 3GPP (3rd Generation Partnership Project) LTE (Long-Term Evolution) standards. Digital transmitters using such structures and architectures may be realized as digital transmitters suitable for Wi-Fi and WLAN (wireless local area network) communications.

In electronic devices, systems, or similar electronic devices and/or systems, features or other combinations of features, as taught herein, may be combined into electronic devices and/or systems according to the teachings herein.

In some embodiments, a mobile device implemented with components as taught herein may be part of a portable wireless communication device, such as a personal digital assistant (PDA), a laptop or portable computer with wireless communication capability, a web tablet, a wireless telephone, a smartphone, a wireless headset, a pager, an instant messaging device, a digital camera, an access point, a television, a medical device (e.g., a heart rate monitor, a blood pressure monitor, etc.), or other device that may receive and/or transmit information wirelessly. In some embodiments, the mobile device may include one or more of a keyboard, a display, a non-volatile memory port, multiple antennas, a graphics processor, an application processor, speakers, and other mobile device elements. The display may be an LCD screen including a touch screen.

The antennas implemented in conjunction with digital signal processors as taught herein may comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) embodiments, the antennas may be effectively separated to take advantage of spatial diversity and the different channel characteristics that may result.

Although some of the structures discussed herein are illustrated as having several separate functional elements, one or more of the functional elements may be combined and may be implemented by combinations of software-configured elements, such as processing elements including components of digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some embodiments, the functional elements may refer to one or more processes operating on one or more processing elements.

Embodiments may be implemented in one or a combination of hardware, firmware, and software. Embodiments may also be implemented as instructions stored on a machine-readable storage device, which may be read and executed by at least one processor to perform the operations described herein. A machine-readable storage device may include any non-transitory mechanism for storing information in a form readable by a machine. For example, a machine-readable storage device may include read-only memory (ROM), random-access memory (RAM), magnetic disk storage media, optical storage media, flash-memory devices, and other storage devices and media. Some embodiments may include one or more processors and may be configured with instructions stored on a machine-readable storage device.

In some embodiments, a communication device having an all digital transmitter may be part of a user equipment (UE) or an evolved Node B (eNB) and may be configured to transmit and/or receive orthogonal frequency division multiplexed (OFDM) communication signals over a multicarrier communication channel in accordance with an orthogonal frequency division multiple access (OFDMA) technique. The OFDM signals may comprise a plurality of orthogonal subcarriers. In some broadband multicarrier embodiments, the UEs and eNBs may be part of a cellular broadband wireless access (BWA) network communication network, such a 3GPP Universal Terrestrial Radio Access Network (UTRAN) LTE or a LTE communication network, although the teachings herein are not limited in this respect.

In some embodiments, a communication device may be configured to receive OFDM communication signals over a multicarrier communication channel. The OFDM signals may comprise a plurality of orthogonal subcarriers. In some of these multicarrier embodiments, receiver 100 may be part of a wireless local area network (WLAN) communication station (STA) such as a wireless access point (AP), base station or a mobile device including a Wireless Fidelity (WiFi) device. In some of these embodiments, communication device 200 may be configured to receive signals in accordance with specific communication standards, such as the Institute of Electrical and Electronics Engineers (IEEE) standards including IEEE 802.11-2012 and/or 802.11n-2009 standards and/or proposed specifications for WLANs, although the teachings herein are not limited in this respect as they may also be suitable to transmit and/or receive communications in accordance with other techniques and standards.

In some other embodiments, a communication device may be configured to receive signals that were transmitted using one or more other modulation techniques such as spread spectrum modulation (e.g., direct sequence code division multiple access (DS-CDMA) and/or frequency hopping code division multiple access (FH-CDMA)), time-division multiplexing (TDM) modulation, and/or frequency-division multiplexing (FDM) modulation, although the scope of the embodiments is not limited in this respect.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description.

What is claimed is:

1. A digital signal processor comprising:
   a binary to thermometer coder having inputs to receive a first number of binary bits of an input baseband signal, the input baseband signal including a second number of binary bits in addition to the first number of binary bits, wherein the first and second number of binary bits being integers, the binary to thermometer coder configured to output bits corresponding to a thermometer code;
   a mixer to mix the bits of the thermometer code with a local oscillator clock signal to operatively provide a reverse order inverted bit pattern;
   exclusive-or circuitry configured to mix the second number of binary bits with the local oscillator clock signal; and
   a plurality of output lines from the mixer and the exclusive-or circuitry to feed a mixed hybrid code to a digital to analog conversion device.

2. The digital signal processor of claim 1, wherein the thermometer code has a number of bits and the mixer includes a number of multiplexers equal in number to the number of bits of the thermometer code, each multiplexer configured to receive the local oscillator clock signal and two bits of the thermometer code with one of the two bits inverted, each of the two bits being from an order of bit locations of the thermometer code, a bit location of a first bit of the two bits spaced apart from a first end of the order by a first number of locations and a second bit of the two bits spaced apart from a second end of the order, opposite the first end, by a second number of locations, the first number of bit locations equal to the second number of bit locations.

3. The digital signal processor of claim 2, wherein the mixer includes an AND gate coupled to an output of one of the multiplexers, the one multiplexer disposed to operate with respect to a center location of the order with the two bits being from the same bit location.

4. The digital signal processor of claim 3, wherein the AND gate includes an input to receive a bit signal from a control block of the digital signal processor in addition to an input to receive the output of the one multiplexer.

5. The digital signal processor of claim 2, wherein the digital signal processor includes a plurality of D flip-flops (DFFs), each DFF coupled to one of the multiplexers to receive an output signal from the respective multiplexer as an data input, each DFF to operate with respect to an inverted logic one at an input of the DFF as a reset, each DFF configured to receive the clock signal, which has the double clock rate of the local oscillator clock signal.

6. The digital signal processor of claim 1, wherein the exclusive-or circuitry includes a plurality of exclusive-or gates, each exclusive-or gate having three inputs, one input configured to receive one of the M bits, one input of the three inputs configured to receive the local oscillator clock signal, and one input of the three inputs configured to receive an invert enable signal from a control block of the digital signal processor.

7. The digital signal processor of claim 6, wherein the exclusive-or circuitry includes, for each exclusive-or gate, an AND gate having an input coupled to an output of the exclusive-or gate and configured to receive a zero enable signal.

8. The digital signal processor of claim 6, wherein the digital signal processor includes a plurality of D flip-flops (DFFs), each DFF coupled to a different one of the exclusive-or gates to receive an output signal from the respective exclusive-or gate as an input, each DFF to operate with respect to an associated inverted quiet bit as a reset, each DFF configured to receive a clock signal, which has clock rate double of the local oscillator clock signal.

9. The digital signal processor of claim 1, wherein the digital signal processor includes a control block having quiet bit logic to generate input to the exclusive-or circuitry, the quiet bit logic configured to receive M quiet bits.

10. The digital signal processor of claim 9, wherein the digital signal processor includes access to a table configured as a source for the M quiet bits received by the control block.

11. A transmitter comprising:
a source of binary bits to receive an input signal and provide binary bits; and
a digital signal processor coupled to the source of binary bits, the digital signal processor including:
a binary to thermometer coder having inputs to receive N binary bits of N+M binary bits from the source, N and M being integers, the binary to thermometer coder configured to output bits corresponding to a thermometer code;
a mixer to mix the bits output from the thermometer code with a local oscillator clock signal to operatively provide a reverse order inverted bit pattern;
exclusive-or circuitry configured to mix the M binary bits with the local oscillator clock signal; and
output lines from the mixer and the exclusive-or circuitry to feed a mixed hybrid code from the digital signal processor.

12. The transmitter of claim 11, wherein the source of binary bits is a baseband modem configured to provide baseband Q-channel data and baseband I-channel data, the digital signal processor is a Q-channel digital signal processor coupled to a Q-channel radio frequency digital-to-analog converter (RF DAC) via the output lines, and the transmitter includes an I-channel digital signal processor configured to feed an I-channel RF DAC.

13. The transmitter of claim 12, wherein the transmitter includes a D flip-flop coupling the I-channel digital signal processor to the I-channel RF DAC, the D flip-flop having an input to receive a clock that is inverted from the clock signal of the Q-channel digital signal processor operable with the I-channel digital signal processor.

14. The transmitter of claim 11, wherein the source of binary bits is a coordinate rotation digital computer (CORDIC) and the N+M binary bits are amplitude data.

15. The transmitter of claim 14, wherein the digital signal processor is coupled to a radio frequency digital-to-analog converter (RF DAC) and the CORDIC is coupled to a phase modulator to provide phase data to the phase modulator and the phase modulator is coupled to the digital signal processor to generate a clock signal to the digital signal processor.

16. The transmitter of claim 11, wherein the transmitter is configured with an antenna coupled to the transmitter.

17. A method of operating a digital signal processor comprising:
receiving an input baseband signal in binary format of N+M binary bits, N and M positive integers;
dividing the N+M binary bits into two sets, one set having N binary bits and the other set having M binary bits;
coding the N binary bits into a thermometer code using a binary-to-thermometer coder;
mixing the thermometer code with a local oscillator clock signal by reverse order inverted bit processing and mixing the M binary bits with the local oscillator clock signal by an exclusive-or processing to generate a mixed hybrid code; and
feeding the mixed hybrid code to a digital to analog conversion device.

18. The method of claim 17, wherein feeding the mixed hybrid code to the digital device includes feeding the mixed hybrid code to a digital to analog converter, digital power amplifier, or digital drive amplifier.

19. The method of claim 17, wherein the N binary bits are an upper set of bits of the N+M binary bits and the M binary bits are a lower set of bits below the N+M binary bits.

20. The method of claim 17, wherein the method includes performing a common-mode level shift for signals feed to a radio frequency digital to analog converter (RF DAC) when a RF DAC signal swing is substantially less than full scale.

21. The method of claim 17, wherein the method includes performing a common-mode level shift to de-activate upper bits, the de-activated upper bits do not toggle between a logic one and a logic zero over a clock signal.

22. The method of claim 21, wherein the common-mode level shift includes:
ordering the M bits from bit $0$ to bit K followed by bit K+1 to bit M−1, K being the number of active bits, an active bit being a one-bit signal that is dynamically changing at a given digital attenuation;
zeroing the bits at bit K to bit M−1; and
reversing the bit at bit K−1.

23. The method of claim 17, wherein mixing the thermometer code with the local oscillator clock signal includes:
inputting two bits of the thermometer code into a multiplexer with one of the two bits being inverted, each of the two bits being from an order of bit locations of the thermometer code, a bit location of a first bit of the two bits spaced apart from a first end of the order by a first number of locations and a second bit of the two bits spaced apart from a second end of the order, opposite the first end, by a second number of locations, the first number of bit locations equal to the second number of bit locations; and
inputting the local oscillator clock signal into the multiplexer.

24. The method of claim 23, wherein mixing the thermometer code with the local oscillator clock signal includes inputting two bits of the thermometer code into a center multiplexer, the center multiplexer disposed to operate with respect to a center location of the order with the two bits being from the same bit location.

25. The method of claim 24, wherein the method includes quieting output of the center multiplexer.

26. The method of claim 25, wherein quieting output of the center multiplexer includes inputting a quiet bit to a D Flip-Flop having the output of the center multiplexer as an input.

* * * * *